(12) United States Patent
Renjan et al.

(10) Patent No.: US 11,651,976 B2
(45) Date of Patent: May 16, 2023

(54) EMBEDDED PACKAGING CONCEPTS FOR INTEGRATION OF ASICS AND OPTICAL COMPONENTS

(71) Applicant: Apple Inc., Cupertino, CA (US)

(72) Inventors: Kishore N. Renjan, Singapore (SG);
Bilal Mohamed Ibrahim Kani, Singapore (SG); Kyusang Kim, Singapore (SG); Manoj Vadeentavida, Singapore (SG); Pierpaolo Lupo, Singapore (SG); Prashanth S. Holenarsipur, Los Altos, CA (US); Praveesh Chandran, Singapore (SG); Vinodh Babu, Singapore (SG); Yuta Kuboyama, San Mateo, CA (US)

(73) Assignee: Apple Inc., Cupertino, CA (US)

( * ) Notice: Subject to any disclaimer, the term of this patent is extended or adjusted under 35 U.S.C. 154(b) by 216 days.

(21) Appl. No.: 16/911,153

(22) Filed: Jun. 24, 2020

(65) Prior Publication Data

US 2021/0090908 A1  Mar. 25, 2021

(51) Int. Cl.
*H01L 21/56* (2006.01)
*H01L 23/31* (2006.01)
(Continued)

(52) U.S. Cl.
CPC .......... *H01L 21/565* (2013.01); *H01L 21/561* (2013.01); *H01L 21/568* (2013.01); *H01L 23/3121* (2013.01); *H01L 23/49811* (2013.01); *H01L 23/49827* (2013.01); *H01L 23/5383* (2013.01); *H01L 23/5389* (2013.01);
(Continued)

(58) Field of Classification Search
CPC ............... H01L 25/167; H01L 23/5389; H01L 2224/2413; H01L 2224/24137; H01L 23/49827; H01L 23/5384; H01L 23/481; H01L 29/4175; H01L 2225/06541–06544; H01L 2225/06548; H01L 21/76898; H01L 25/0655; H01L 25/072; H01L 25/0753; H01L 25/042; H01L 25/115; H01L 31/02325; H01L 31/173; H01L 21/565;
(Continued)

(56) References Cited

U.S. PATENT DOCUMENTS 9,786,617 B2  10/2017  Liu et al.
9,905,722 B1  2/2018  Chen et al.
(Continued)

FOREIGN PATENT DOCUMENTS

CN  104681457 A  6/2015
CN  104961916 A  10/2015
(Continued)

OTHER PUBLICATIONS

Singapore Patent Application No. 10201908828W, "Search Report and Written Opinion" dated Aug. 3, 2020, 14 pages.
(Continued)

*Primary Examiner* — Younes Boulghassoul
*Assistant Examiner* — Quinton A Brasfield
(74) *Attorney, Agent, or Firm* — Aikin & Gallant, LLP

(57) ABSTRACT

Optical packages and methods of fabrication are described. In an embodiment, a controller chip is embedded along with optical components, including a photodetector (PD) and one or more emitters, in a single package.

15 Claims, 28 Drawing Sheets

(51) Int. Cl.
   *H01L 23/498* (2006.01)
   *H01L 23/538* (2006.01)
   *H01L 23/00* (2006.01)
   *H01L 25/065* (2023.01)

(52) U.S. Cl.
   CPC .............. *H01L 24/13* (2013.01); *H01L 24/16* (2013.01); *H01L 24/48* (2013.01); *H01L 24/97* (2013.01); *H01L 25/0655* (2013.01); *H01L 2224/02372* (2013.01); *H01L 2224/02373* (2013.01); *H01L 2224/04105* (2013.01); *H01L 2224/12105* (2013.01); *H01L 2224/13099* (2013.01); *H01L 2224/48135* (2013.01)

(58) Field of Classification Search
   CPC .............. H01L 23/3121; H01L 21/568; H01L 31/02161; H01L 33/56
   See application file for complete search history.

(56) References Cited

U.S. PATENT DOCUMENTS

| | | | |
|---|---|---|---|
| 9,911,629 | B2 | 3/2018 | Hsu et al. |
| 2009/0115049 | A1 | 5/2009 | Shiraishi et al. |
| 2011/0064362 | A1 | 3/2011 | Slavov et al. |
| 2013/0221470 | A1 | 8/2013 | Kinsman et al. |
| 2014/0097536 | A1 | 4/2014 | Schunk |
| 2014/0296411 | A1 | 10/2014 | Cheng et al. |
| 2015/0001713 | A1 | 1/2015 | Goetz et al. |
| 2015/0028359 | A1 | 1/2015 | Tu et al. |
| 2015/0262984 | A1* | 9/2015 | Krabe .................... H01L 24/96 438/107 |
| 2017/0053903 | A1* | 2/2017 | Nishimura .............. H01L 25/50 |
| 2018/0182913 | A1 | 6/2018 | Chen et al. |
| 2018/0301443 | A1 | 10/2018 | Kim et al. |
| 2019/0067244 | A1* | 2/2019 | Chen ...................... H01L 24/80 |
| 2019/0166684 | A1 | 5/2019 | Bird et al. |
| 2019/0341505 | A1* | 11/2019 | Liu ........................ H01L 31/173 |
| 2020/0006088 | A1* | 1/2020 | Yu .......................... H01L 24/32 |
| 2021/0005761 | A1* | 1/2021 | Tsai ...................... H01L 25/165 |
| 2022/0131339 | A1* | 4/2022 | Ohara .................. H01L 25/167 |

FOREIGN PATENT DOCUMENTS

| | | |
|---|---|---|
| KR | 20160116484 A | 10/2016 |
| TW | 201823799 A | 7/2018 |

OTHER PUBLICATIONS

Taiwan Patent Application No. 109125516, "Search Report" dated Mar. 24, 2021, 1 pages.

* cited by examiner

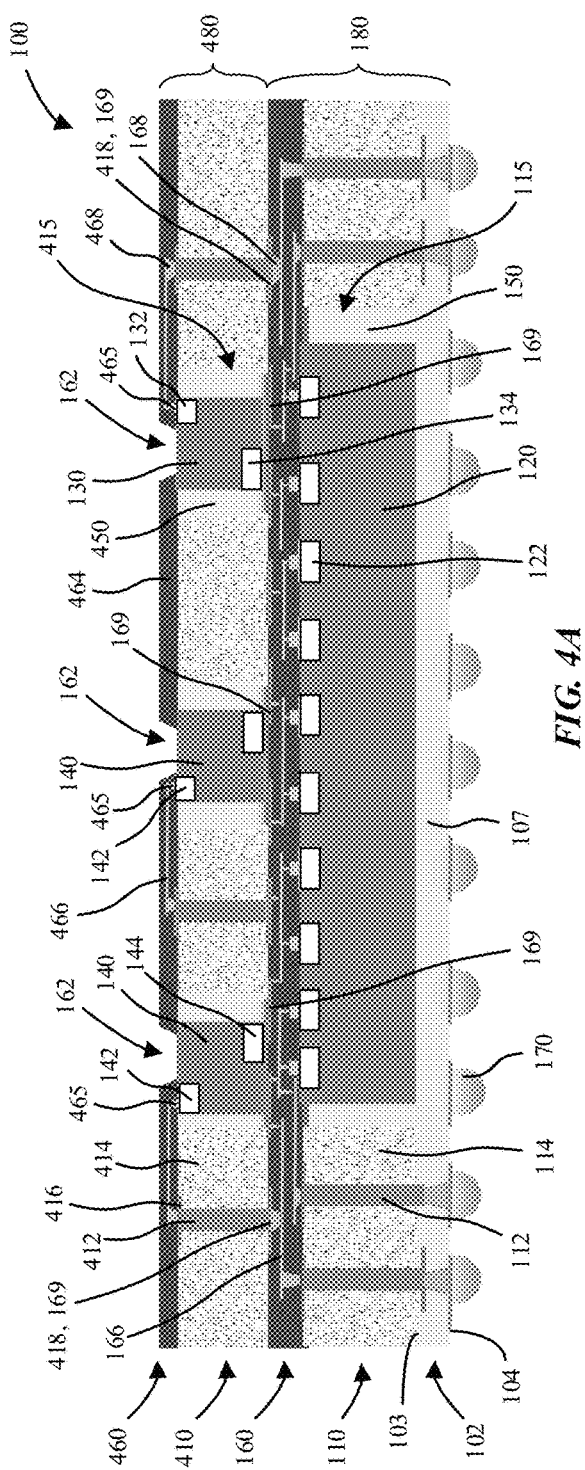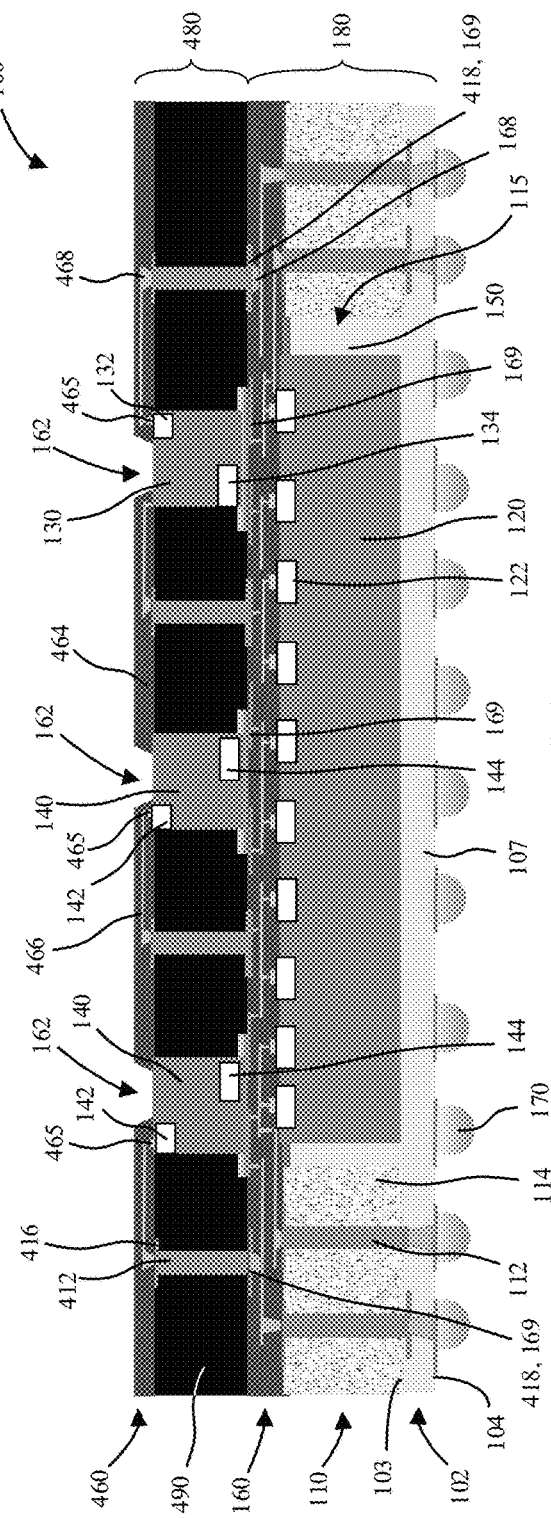
FIG. 4A
FIG. 4B

EMBEDDED PACKAGING CONCEPTS FOR INTEGRATION OF ASICS AND OPTICAL COMPONENTS

RELATED APPLICATIONS

This application claims the benefit of priority of Singapore Patent Application No. 10201908828 W filed Sep. 23, 2019, which is incorporated herein by reference.

BACKGROUND

Field

Embodiments described herein relate to microelectronic packaging, and more specifically to optical packages.

Background Information

As microelectronic devices become increasingly smaller and more portable, sensors are increasingly being incorporated in order to detect the environment or context associated with use of the devices. Among such sensors include light sensors or proximity sensors, which can detect ambient light or proximity to a target object such as a user's ear or face. In one implementation a proximity sensor can include a light source and photodetector (PD). In application, the PD may detect proximity to a target object by measuring the amount of light from the light source.

SUMMARY

Optical packages and methods of fabrication are described in which a controller chip is embedded along with optical components, including one or more photodetectors (PDs) and one or more emitters in a single package. In one implementation, the controller chip and optical components are arranged side-by-side in a single package level. In other implementations, the controller chip is embedded in a first package level, and the optical components are stacked on top of the controller chip in a second package level. The optical components may be routed using various solutions including redistribution layers (RDLs), printed circuit boards (PCBs), vertical vias and wire bonding. In some implementations laser direct structuring (LDS) techniques are utilized for electrical wiring connections.

BRIEF DESCRIPTION OF THE DRAWINGS

FIGS. 4A-4B are schematic cross-section side view illustrations of optical packages with optical components stacked on top of a controller chip in accordance with embodiments.

DETAILED DESCRIPTION

Figure 1:
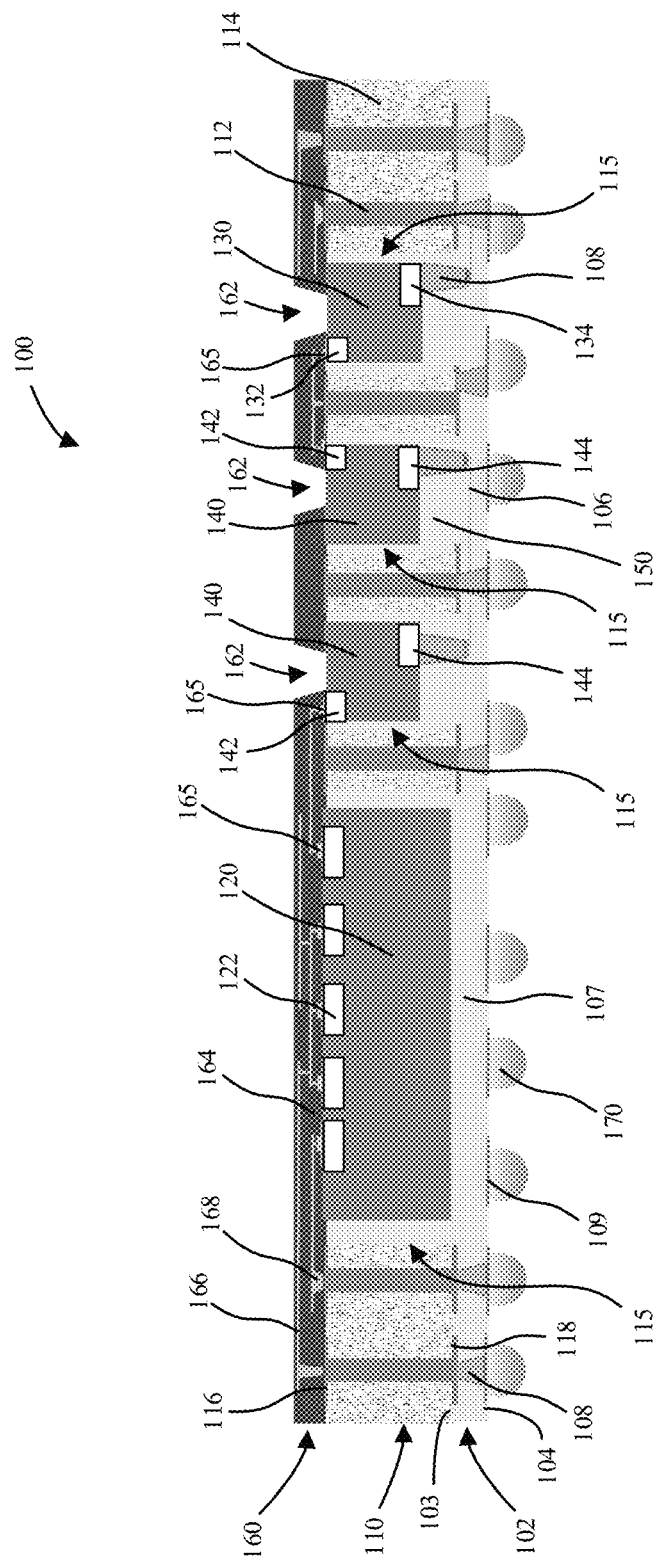
FIG. 1 is a schematic cross-sectional side view illustration of an optical package including side-by-side controller chip and optical components in accordance with an embodiment.

Embodiments describe optical packages and methods of fabrication. In particular, the optical packages may be incorporated as light sensors or proximity sensors in portable electronic devices. In one aspect, the optical packages in accordance with embodiments embed a controller chip along with one or more photodetectors (PDs) and one or more emitters in a single package. The controller chip may function to control operation of the one or more PDs and emitters. For example, the controller chip can be an application specific integrated circuit (ASIC) or field-programmable gate array (FPBA). It has been observed that traditional optical packages for proximity sensors mount the PD and light source onto a flex circuit. This end of the flex circuit can be mounted to a housing, while the opposite end of the flex circuit is routed to a controller on a circuit board located elsewhere in the housing. It has been observed that such a configuration can be particularly susceptible to mechanical shock, as well as to external electromagnetic interference (EMI). In one aspect the optical packages and methods of fabrication in accordance with embodiments provide an alternative layout and form factor compared to traditional optical packages. In some embodiments, the optical packages can provide EMI suppression, and mitigate mechanical shock. For example, EMI suppression can be accomplished by adding an EMI shield to the finished package, or a metal lid. Mechanical shock can be mitigated by embedding the multiple components into a single package, rather than having multiple components connected on opposite ends of a flex circuit. Furthermore, the optical packages in accordance with embodiments may be considered a system-in-package which allows for standalone testing and calibration. Some embodiments may additionally be compatible with flexible substrates, and silicone molding compounds.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The term "routing layer" as used herein may refer to a variety of routings including single and multiple layer structures, including a redistribution layer (RDL), printed circuit board (PCB), and metal trace layer such as that formed with laser direct structuring. The term "emitter" as used herein is inclusive of a light emitting diode (LED), including a vertical cavity surface emitting laser (VCSEL).

In the following description various configurations and fabrication sequences are described that may share similar materials, arrangements, or processes. In interests of clarity and conciseness, like features may not necessarily be described in the same detail in subsequent illustrations and processes. Accordingly, it is to be understand that a particular description with respect to a particular illustration may also be applicable to alternative configurations and illustrations that share the same or similar feature.

Referring now to FIG. 1 a cross-sectional side view illustration is provided of an optical package 100 including side-by-side controller chip 120 and optical components, including one or more emitters 140 and PD 130, in accordance with an embodiment. For example, the multiple different emitters 140 may be designed to emit at different wavelengths, or intensities. In an embodiment, an optical package 100 includes a back side routing layer 102 including a top side 103 and bottom side 104, and a printed circuit board (PCB) core 110 on the top side 103 of the back side routing layer 102. The PCB core 110 may include a plurality of vertical vias 112 and a plurality of cavities 115. A controller chip 120 is located face-up within a first cavity of the plurality of cavities 115, and a photodetector (PD) 130 is located within a second cavity of the plurality of cavities 115. A molding compound 150 encapsulates the controller chip 120 within the first cavity 115 and the PD 130 within the second cavity 115. The molding compound 150 may be formed of a suitable molding material, including epoxy, and more flexible materials such as silicone. A front side routing layer 160 is located on top of the controller chip 120, the molding compound 150, the PCB core 110. An aperture 162 is formed within the front side routing layer 160 over the PD 130. The optical package 100 may additionally include a plurality of solder bumps 170 on the bottom side 104 of the back side routing layer 102, for example, for mounting on a mother board or other system component of an electronic device.

The optical packages 100 in accordance with embodiments may include on or more emitters 140 and one or more PDs 130. In the particular embodiment illustrated in FIG. 1, the one or more emitters 140 are located within respective cavities 115, and respective apertures 162 are formed within the front side routing layer 160 over the respective emitters 140, similarly as with the PD 130. As illustrated, the apertures 162 may have maximum widths that are less than the maximum widths of the top surfaces of the corresponding optical components (e.g. emitter, PD).

In accordance with embodiments, the PCB core 110 may be a laminate body 114. For example, the PCB core 110 can be a composite of woven fiberglass cloth and polymer (e.g. resin). The PCB core 110 may be formed of a variety of suitable PCB materials including FR4, prepreg, polyimide, etc. The PCB core 110 may be rigid or flexible. Vertical vias 112 may be copper pillars, for example, formed using a plating technique after drilling via holes through the PCB core 110. The PCB core 110 may include top side landing pads 116, and bottom side landing pads 118.

The optical components in accordance with embodiments may be vertical components, including top electrodes and bottom electrodes. Specifically, the PD 130 may have a top electrode 132 and bottom electrode 134, and the emitter(s) may have a top electrode 142 and bottom electrode 144. The front side routing layer 160 may include contact pads 165 that are formed on, and may be directly on, the top electrode 132 of the PD 130, and top electrode 142 of the emitters 140. Contact pads 165 may also be formed on, and may be directly on, the contact pads 122 of a face-up controller chip 120, and vertical vias 112 or top side landing pads 116.

In an embodiment such as that illustrated in FIG. 1, the front side routing layer 160 can be a front redistribution layer (RDL), which may be formed directly on the underlying structure in a layer-by-layer process using thin film processing techniques. For example, a front RDL may include one or more metal traces 166, one or more dielectric layers 164, vias 168, and contact pads 165. The RDL may be formed of suitable materials. For example, the dielectric layer(s) 164 may be formed of a photoimageable dielectric material including polymers (e.g. polyimide, epoxy, epoxy blends, etc.) or inorganic materials (e.g. oxide, nitride), while the metal traces 166 and vias 168 may be formed of a suitable metal, including copper. Similarly contact pads 165 may be formed of on or more metals, including copper.

In an embodiment such as that illustrated in FIG. 1, the back side routing layer 102 is an RDL. The back side routing layer 102 may be formed similarly as the front side routing layer 160 previously described. The back side routing layer 102 can include one or more dielectric layers 107, vias 108, contact pads 109, and optionally metal traces 106. In an embodiment, one or more of the dielectric layer(s) 107 is formed of the same material as the molding compound 150, and may be formed simultaneously with the molding compound 150. In accordance with embodiments, the PD 130 has a bottom electrode 134 that is electrically connected to the back side routing layer 102. Similarly, each emitter 140 has a bottom electrode 144 that is electrically connected to the back side routing layer 102. Vias 108 of the back side routing layer 102 may be formed through the dielectric layer 107 to make contact with the PD 130 and emitters 140. Dielectric layer 107 may be separate from, or a portion of the molding compound 150. In an embodiment, the vias 108 extend through the molding compound 150 to contact the bottom electrodes 134, 144 of the PD 130 and emitters 140, respectively, and may optionally extend through one or more additional dielectric layers 107. Vias 108 may additional contact a metal trace 106, or bottom side landing pad 118 of the PCB core 110.

Figure 2:
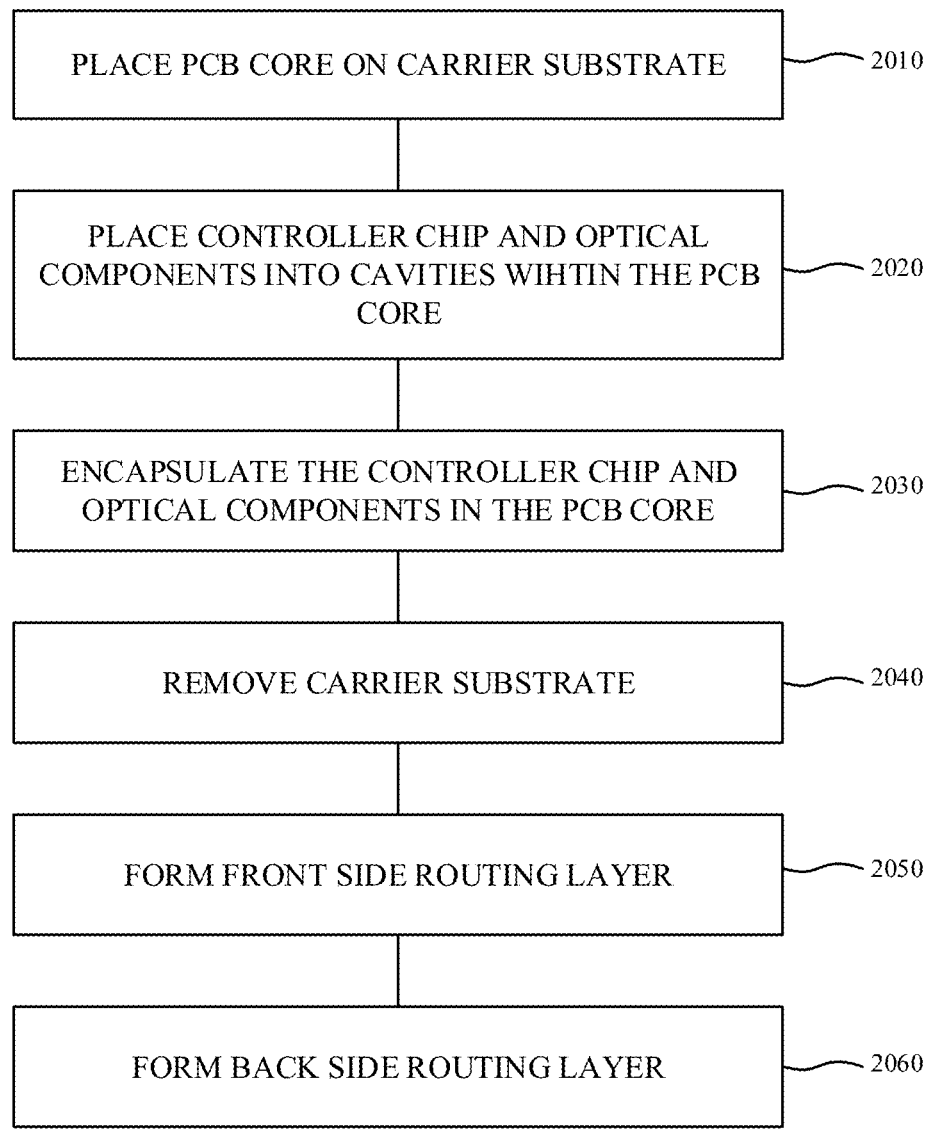
FIG. 2 is a process flow of a method of fabricating the optical package of FIG. 1 in accordance with an embodiment.

FIG. 2 is a process flow of a method of fabricating the optical package of FIG. 1 in accordance with an embodiment. FIGS. 3A-3F are schematic cross-sectional side view illustrations of a method of fabricating the optical package of FIG. 1 in accordance with an embodiment. In interest of clarity and conciseness, the structures and process flow of FIGS. 2 and 3A-3F are described together in the following description.

Figure 3A:
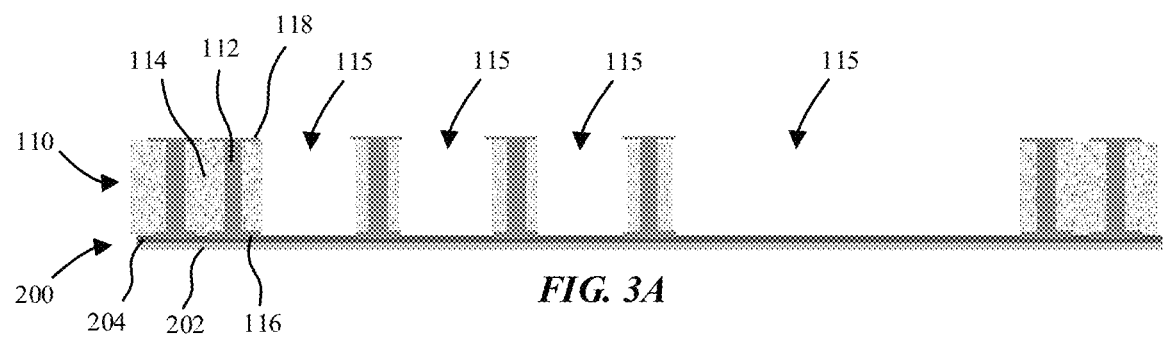
FIGS. 3A-3F are schematic cross-sectional side view illustrations of a method of fabricating the optical package of FIG. 1 in accordance with an embodiment.
Figure 3B:
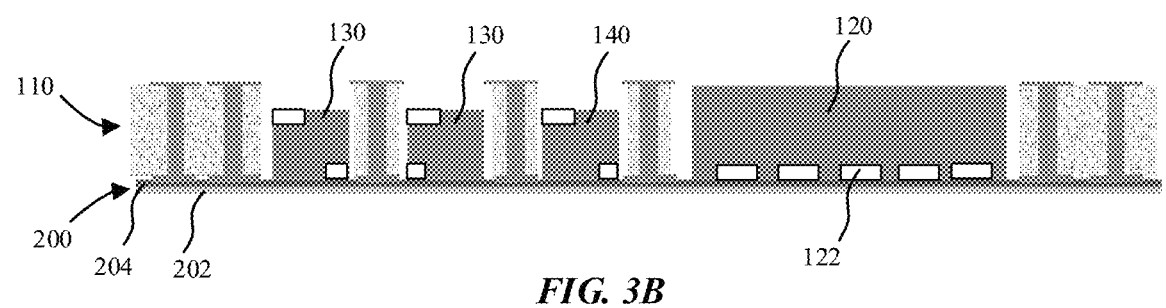

At operation 2010 a PCB core 110 is placed on a carrier substrate 200. As shown in FIG. 3A, the carrier substrate 200 may include a support substrate 202 and adhesive layer 204. The controller chip 120 and optical components (e.g. PD 130, emitters 140) are then placed into the cavities 115 in the PCB core 110 at operation 2020, as illustrated in FIG. 3B. In an embodiment, the cavities 115 are deeper than the controller chip 120 and optical components are tall such that there is a clearance height.

Figure 3C:
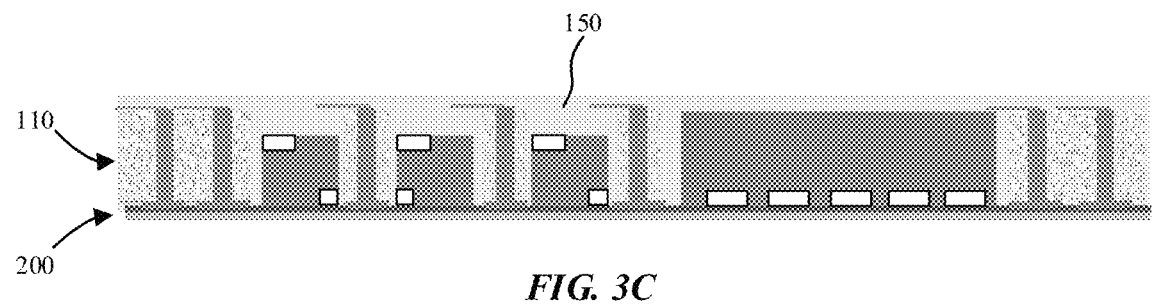

Referring now to FIG. 3C, at operation 2030 the controller chip 120 and optical components are encapsulated in the PCB core 110, for example using a molding compound 150. In the particular embodiment illustrated in FIG. 3C, the molding compound 150 fills remaining volume within the cavities 115 not already occupied by the controller chip 120 and optical components, and may additionally cover the top surface (at this processing stage) of the PCB core 110 including what will be the bottom side landing pads 118. The carrier substrate 200 may then be removed at operation 2040 to expose top side landing pads 116, controller chip 120 contact pads 122, at top electrodes 142, 132 of the emitters 140 and PD 130.

Figure 3D:
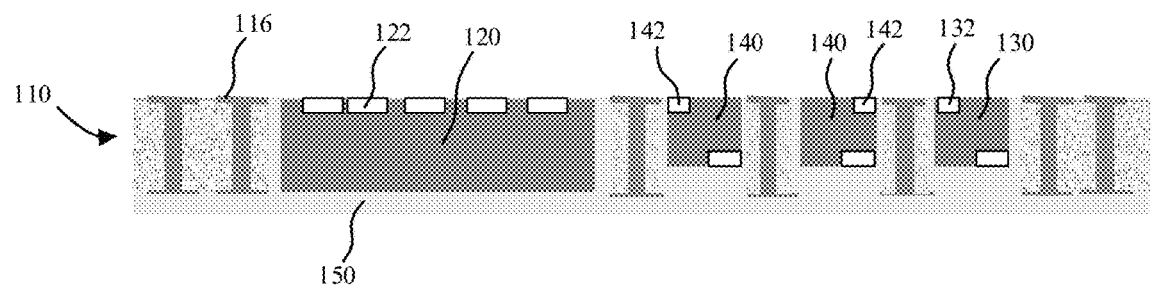
Figure 3E:
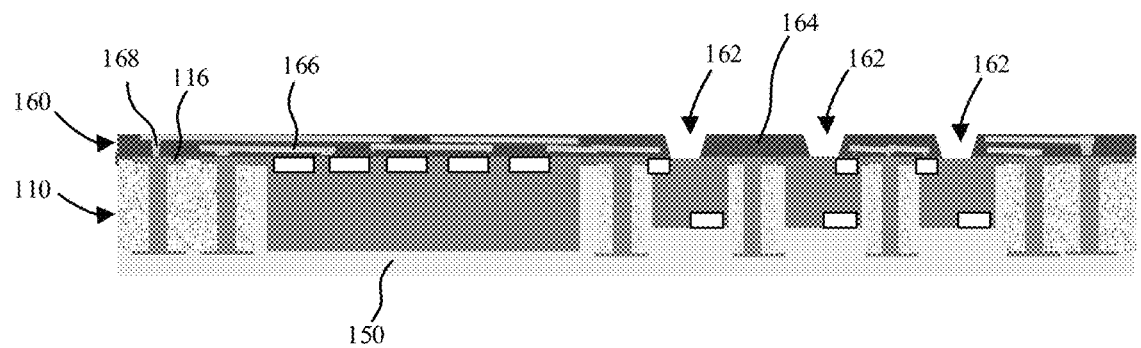

The front side routing layer 160 is then formed at operation 2050. As illustrated in FIG. 3E, the front side routing layer 160 is an RDL including one or more metal traces 166, one or more dielectric layers 164, vias 168, and contact pads 165. Apertures 162 are additionally formed in the front side routing layer 160 to expose top surfaces of the optical components.

Figure 3F:
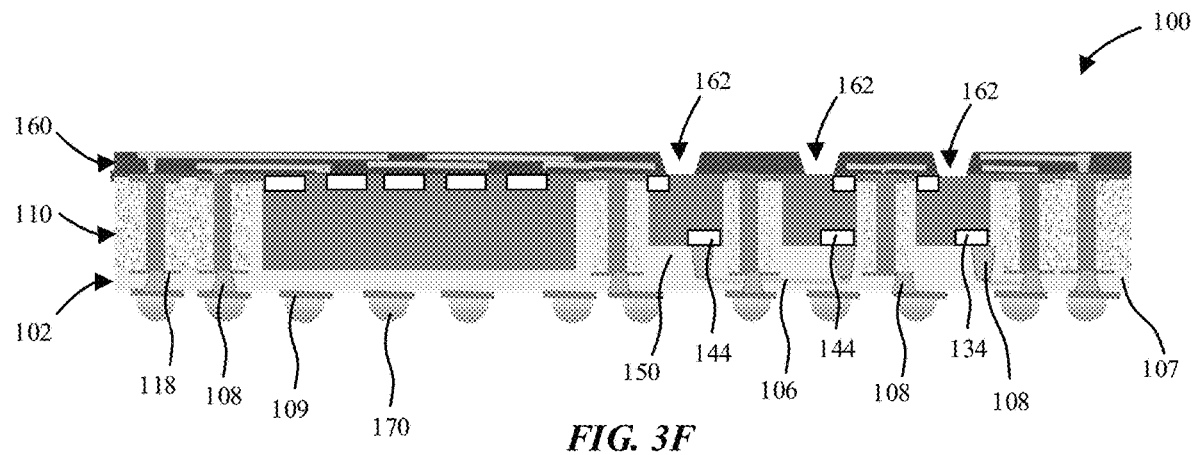

The back side routing layer 102 is then formed at operation 2060. As illustrated in FIG. 3F, the back side routing layer 102 is an RDL including one or more dielectric layers 107, vias 108, and contact pads 109, and optionally one or more metal traces 106. As shown in FIGS. 3D-3F, the back side routing layer 102 may include a portion of the molding compound 150. Thus, formation of the back side routing layer 102 may include forming vias 108 through the existing portion of the molding compound 150 covering the PCB core 110 from operation 2030. Additional dielectric layers 107 may also be formed. Dielectric layers 107 may be formed of suitable materials, including the molding compound 150 material, polymers, oxide, nitride, etc. Solder bumps 170 are then placed onto the contact pads 109.

FIGS. 4A-4B are schematic cross-section side view illustrations of optical packages 100 with optical components stacked on top of a controller chip 120 in accordance with embodiments. In each embodiment, the optical package 100 includes a first (lower) package level 180 and a second (upper) package level 480 on top of the first package level 180. Notably, the first package levels 180 in each of the embodiments illustrated in FIGS. 4A-4B may be similar to the optical package 100 of FIG. 1, with the second package levels 480 of FIGS. 4A-4B being formed using alternative materials and processes.

In an embodiment, such as that illustrated in FIGS. 4A-4B, an optical package 100 includes a first package level 180 that includes a back side routing layer 102 including a top side 103 and a bottom side 104, and a controller chip 120 on the top side 103 of the back side routing layer 102. The first package level 180 additionally a front side routing layer 160 on top of the controller chip 120, and a first plurality of vertical vias 112 extending between the front side routing layer 160 and the back side routing layer 102. The first package level 180 may be substantially similar to the optical package 100 of FIG. 1, less the optical components.

Still referring to FIGS. 4A-4B, the second package level 480 can include one or more PDs 130 mounted on an in electrical contact with the front side routing layer 160, and one or more emitters 140 mounted on and in electrical contact with the front side routing layer 160. A top side routing layer 460 is further located on an in electrical contact with the one or more PDs 130 and emitters 140, and a second plurality of vertical vias 412 extend between the top side routing layer 460 and the front side routing layer 160. Apertures 162 are formed within the top side routing layer 460 over the respective emitters 140, and PD 130 similarly as apertures 162 previously described.

In each of the embodiments illustrated in FIGS. 4A-4B, the controller chip 120 is face-up on the back side routing layer 102. Similar to FIG. 1, in each of the embodiments illustrated in FIGS. 4A-4B the first package level 180 may include a PCB core 110 on the top side 103 of the back side routing layer 102, with the PCB core 110 including the first plurality of vertical vias 112 and a cavity 115, where the controller chip 120 is face-up within the cavity 115. The PCB core 410 may include top side landing pads 416, and bottom side landing pads 418.

The top side routing layer 460 can be a top redistribution layer (RDL), which may be formed on the underlying structure in a layer-by-layer process. For example, a top RDL may include one or more metal traces 466, one or more dielectric layers 464, vias 468, and contact pads 465. Contact pads 465 are formed on, and may be directly on, the top electrode 132 of the PD 130, and top electrode 142 of the emitters 140. The RDL may be formed of suitable materials. For example, the dielectric layer(s) 464 may be formed of a photoimageable dielectric material including polymers (e.g. polyimide, epoxy, epoxy blends, etc.) or inorganic materials (e.g. oxide, nitride), while the metal traces 466 and vias 468 may be formed of a suitable metal, including copper. Similarly contact pads 465 may be formed of one or more metals, including copper.

Referring to FIG. 4A, the second package level 480 may be formed similarly as the first package level 180. In an embodiment, the second package level 480 includes a second PCB core 410 on the front routing layer 160. Similar to PCB core 110, the second PCB core 410 includes a plurality of vertical vias 412 and a plurality of cavities 415, and each PD 130 and emitter 140 is within a respective cavity 415. The second package level 480 may be substantially fabricated separately from the first package level 180 then bonded together. In an embodiment, the second package level 480 is hybrid bonded to the first package level 180. This may occur at the panel level for example. Hybrid bonding may include a plurality of metal-metal bonds between the PCB core 410 and front side routing layer 160. For example, metal-metal bonds may be formed between bottom side landing pads 418 or vertical vias 412 of the PCB core 410, and/or bottom electrodes 144, 134 of the optical components, and the metal traces 166 (including contact pads 169) or vias 168 of the front side routing layer 160. Oxide-oxide bonds may be formed between dielectric layers 164 of the PCB core 410 and dielectric layer of the PCB core 410, which may be a surface layer or part of the body 414. Alternatively, the second package level 480 is hybrid bonded to the first package level 180 with a plurality of conductive joints, such as conductive past, conductive film, or solder bumps. In an embodiment solder bumps (not illustrated) are used to bond the bottom side landing pads 418 or vertical vias 412 of the PCB core 410 and metal traces 166 or vias 168 of the front side routing layer 160.

Referring to FIG. 4B, the second package level 480 may be formed on the first package level 180, for example using the first package level 180 as a reconstituted substrate. In such an embodiment, the PD 130, emitters 140, and the second plurality of vertical vias 412 can be encapsulated in a molding compound 490. The top side routing layer 460 may be formed similarly as the top side routing layer 460 of FIG. 4A.

Figure 5A:
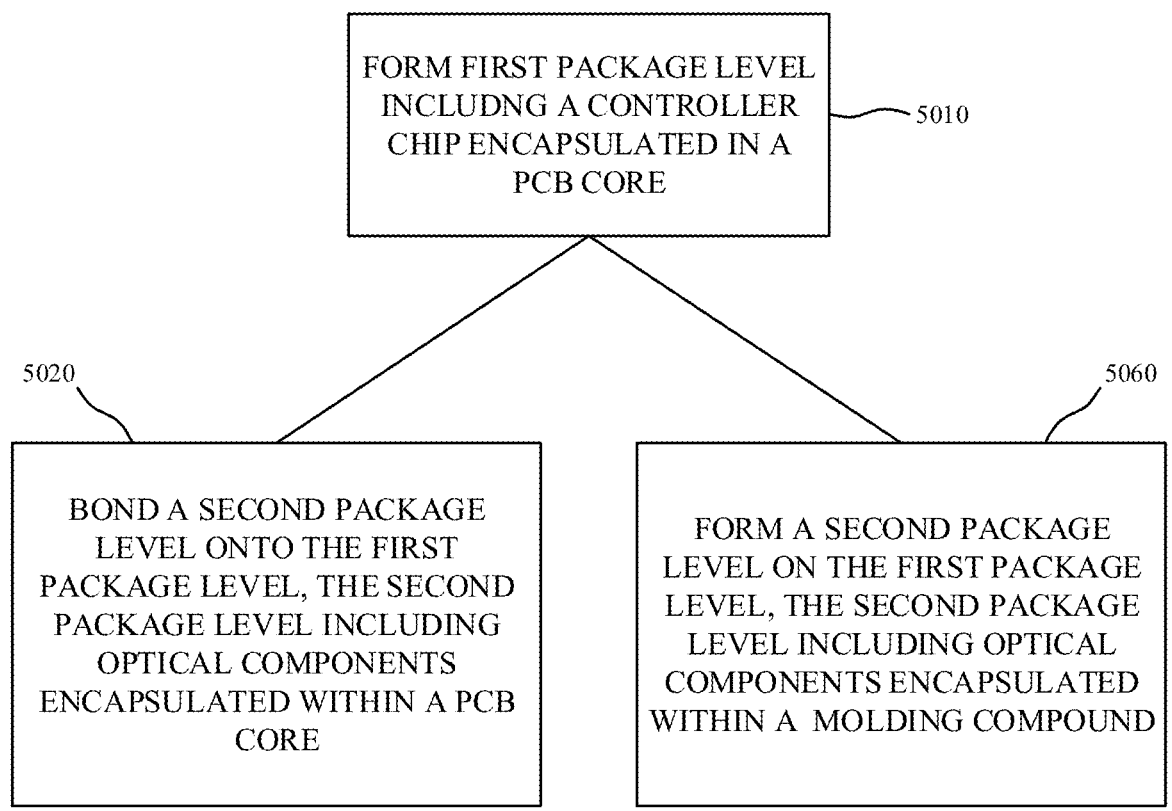
FIG. 5A is a process flow of methods of fabricating the optical packages of FIGS. 4A-4B in accordance with embodiments.

FIG. 5A is a process flow of methods of fabricating the optical packages of FIGS. 4A-4B in accordance with embodiments. At operation 5010 the first package level 180 is formed including the controller chip 120 encapsulated in a PCB core 110. This process flow can be substantially similar to that illustrated and described with regard to FIGS. 1-3F, less the optical components. The fabrication sequence can then take different paths depending upon the structure of the second package level 480. In an embodiment, at operation 5020 a second package level 480 is bonded onto the first package level 180. For example, this may correspond to the embodiment illustrated in FIG. 4A in which the second package level 480 includes the optical components encapsulated within the PCB core 410. In an embodiment, at operation 5060 the second package level 480 is formed on the first package level 180. For example, this may correspond to the embodiment illustrated in FIG. 4B in which the second package level includes the optical components encapsulated within a molding compound 490. In further variations, this molding compound can be a laser direct structuring compatible molding compound.

Figure 5B:
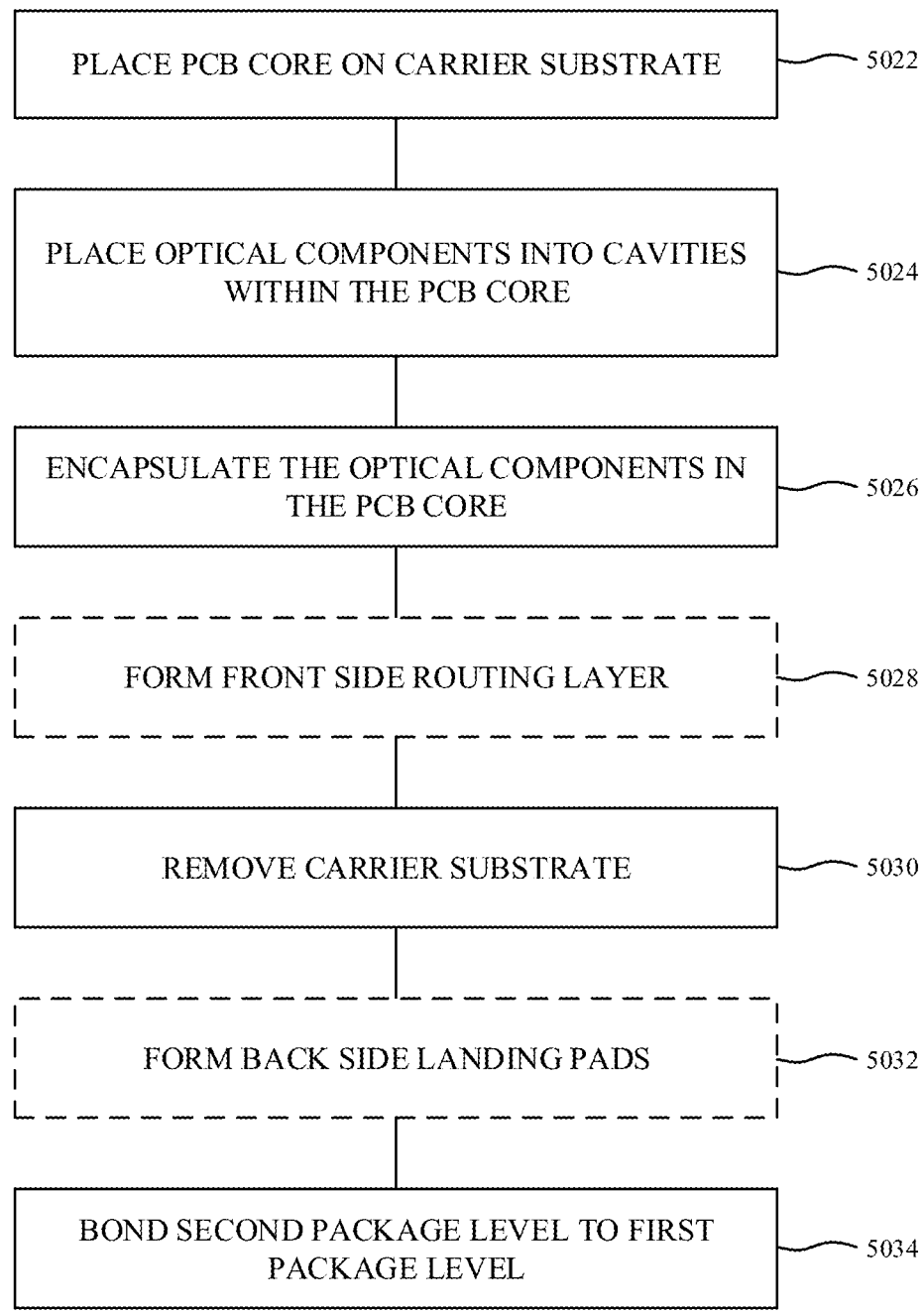
FIG. 5B is a process flow of a method of fabricating the optical package of FIG. 4A in accordance with an embodiment.

Referring now to FIG. 5B, a process flow is provided of a method of fabricating the optical package of FIG. 4A in accordance with an embodiment. At operation 5022 a PCB core 410 is placed onto a carrier substrate. The optical components (e.g. one or more PDs 130 and one or more emitters 140) are placed within cavities 415 in the PCB core 410 at operation 5024. The optical components are then encapsulated in the PCB core 410 with a molding compound 450 at operation 5026. At this point, the top side routing layer 460 can optionally be formed at operation 5028, followed by removal of the carrier substrate at operation 5030. Bottom side landing pads 418, or additional routing, can then optionally be formed at operation 5032 on surface exposed after removal of the carrier substrate. The second package level 480 is then bonded to the first package level 180 at operation 5034. For example, this can be hybrid bonding or bonding with conductive bumps, such as solder bumping. In one variation, the top side routing layer 460 can be formed after bonding the second package level 480 to the first package level 180.

Figure 5C:
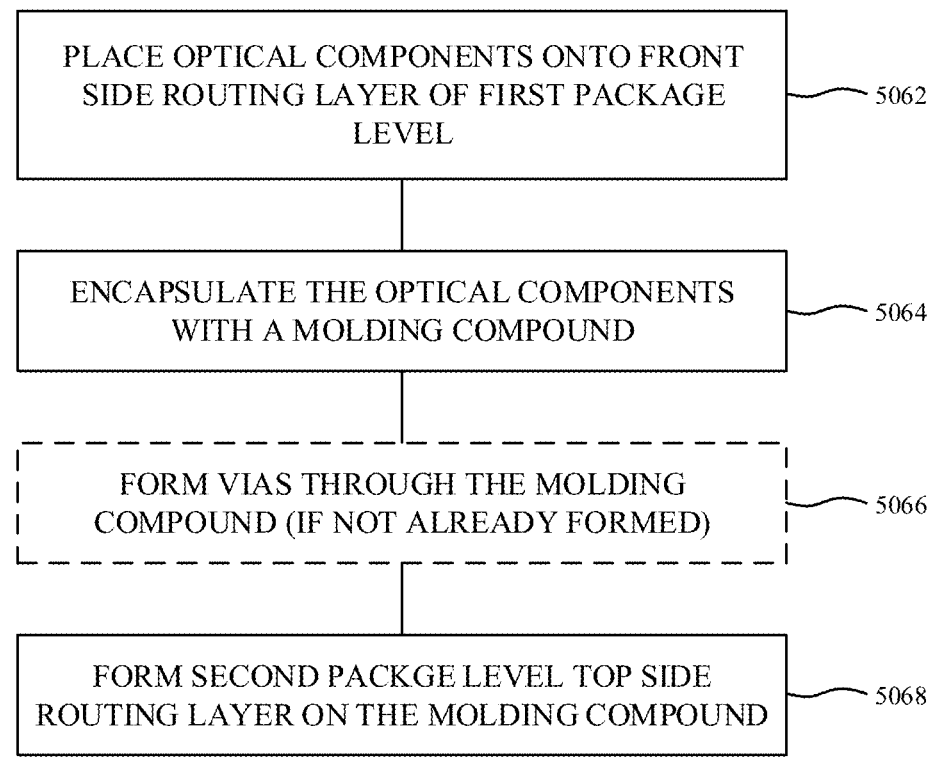
FIG. 5C is a process flow of a method of fabricating the optical package of FIG. 4B in accordance with an embodiment.

FIG. 5C is a process flow of a method of fabricating the optical package of FIG. 4B in accordance with an embodiment. At operation 5062 the optical components (e.g. one or more PDs 130 and one or more emitters 140) are placed onto the front side routing layer 160 of the first package level 180. For example, the optical components may be bonded using conductive bumps, such as conductive films, pastes, solder bumping, etc. As illustrated, bottom electrodes 144, 134 are bonded to the metal traces 166 (or contact pads 169) or vias 168 of the front side routing layer 160. The optical components are then encapsulated on the front side routing layer 160 with a molding compound 490 at operation 5064. The molding compound 490 may be opaque, e.g. black, in some embodiments. In some embodiments, vertical vias 412 are then formed at operation 5066 where the molding compound 490 is etched followed by plating of the vertical vias 412. Alternatively, the vertical vias 412 can be formed prior to encapsulation with the molding compound 490. For example, this can be by plating or gang bonding copper pins to the front side routing layer 160 with solder. The second package level top side routing layer 460 can then be formed on the molding compound 490 and the optical components as previously described at operation 5068.

As described in various embodiments, a molding compound can be used to encapsulate the optical components in the second package level. Further, while a PCB core 110 has been described and illustrated in at least the first package level, this is not required in accordance with embodiments, and the controller chip can alternatively be encapsulated with a molding compound similarly as with the optical components. In yet another variation, the molding compound used to encapsulate the optical components and/or controller chip can be a laser direct structuring (LDS) compatible material. In this manner, LDS structuring can be utilized to form a variety of interconnect structures through or on the molding compound, including vertical vias, and routing layers (inclusive of contact pads).

LDS compatible molding compounds in accordance with embodiments may include a matrix material, and a LDS additive dispersed in the matrix material. For example, the LDS additive may be a non-conductive metal organic compound. This may include a variety of metal oxide compositions, which may be compounded with (e.g. complexed) with the matrix material (e.g. resin). In an exemplary embodiment, the LDS additive is a dispersed tin oxide composition that is complexed with the matrix material. Embodiments are not limited to tin oxide, and a variety of other non-conductive metal organic compounds may be used, including other compounded metal oxides.

A variety of organic materials can be used for the matrix material, which may be dependent upon temperature exposure. Low temperatures materials include polycarbonate (PC) and acrilonitrile butadiene styrene (ABS). Medium temperature material that can withstand soldering temperatures include polycaprolactam (PA6/6) and polyphthalamides (PPA). A higher temperature material that can withstand virtually any soldering polyether ether ketone (PEEK). Other suitable material may include polypropylene (PP), polyethylene terpthalate (PET), polybutylene terpthalate (PBT), polyphenylene sulfide (PPS), and liquid crystal polymers (LCP).

The LDS additive, and laser parameters as selected so that upon application of the laser to the molding compound, the elemental metal in the non-conductive metal organic compound breaks from the compound and forms nucleation particles, forming a conducting path corresponding to the laser pattern. The nucleation particles can then be used as a nucleation layer for a subsequent electroless plating process to fully form the interconnect structures. Various metal layers can be formed with the electroless plating process including gold, nickel, silver, zinc, tin, etc.

Figure 6A:
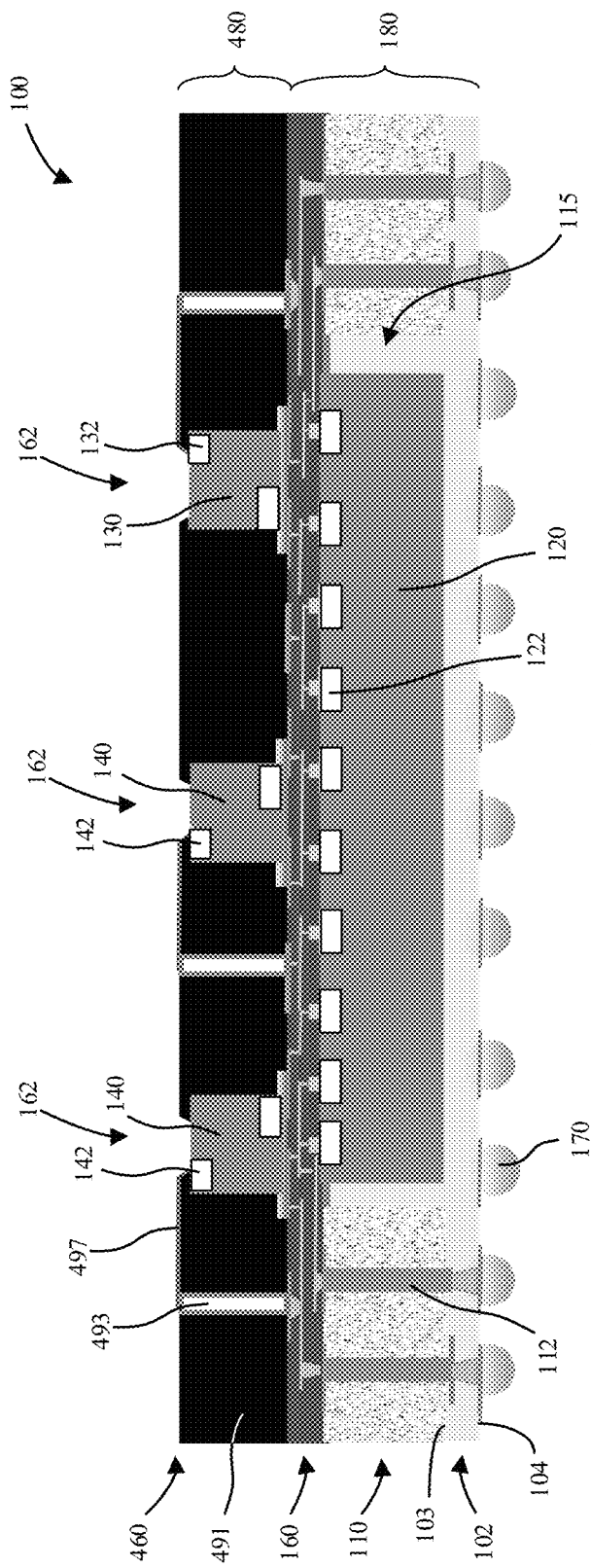
FIG. 6A is a schematic cross-sectional side view illustration of an optical package including optical components stacked on top of a controller chip and second package level laser direct structuring in accordance with an embodiment.

FIG. 6A is a schematic cross-sectional side view illustration of an optical package 100 including optical components stacked on top of a controller chip 120 and second package level laser direct structuring in accordance with an embodiment. The embodiment illustrated in FIG. 6A is substantially similar to that illustrated and described with regard to FIG. 4B with a difference being the molding compound 491 being an LDS compatible material that includes a dispersed non-conductive metal organic compound. In such a configuration, LDS can be used to form trace routing 497 as well as the vertical vias 493. Alternatively trace routing 497 may be formed similarly as metal traces 466. In an embodiment, the top side routing layer 460 includes trace routing 497 that includes a nucleation layer of metal particles of the metal in the dispersed non-conductive metal organic compound. Similarly the vertical vias 493 can include the nucleation layer of metal particles of the metal in the dispersed non-conductive metal organic compound. Both the trace routing 497 and vertical vias 493 can additionally include a bulk conductive layer (e.g. copper) that is plated on top of the nucleation layer of metal particles. Trace routing 497 and vertical vias 493 may otherwise have similar layouts and connections as the metal traces 466 and vertical vias 412.

Figure 6B:
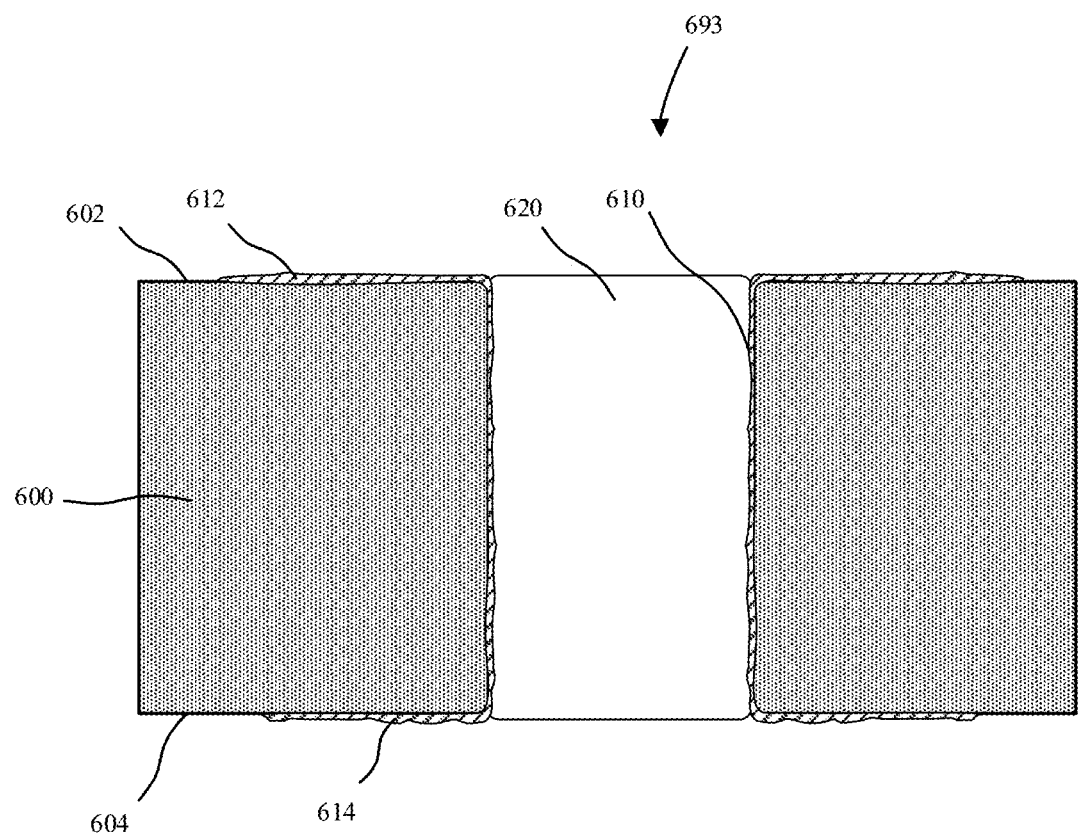
FIG. 6B is a schematic cross-sectional side view illustration of a laser direct structuring via in accordance with an embodiment.

Referring briefly to FIG. 6B an exemplary vertical via 693 is illustrated as formed in an LDS compatible molding compound 600 including a top side 602 and bottom side 604. As shown, a laser pattern can be used to form metal nucleation layers 610 along sidewalls of the molding compound 600 that will become vertical vias 693. Additionally, the nucleation layers 612, 614 can be formed on the top and bottom sides of the molding compound to support additional electrical routing layers. In the illustrated embodiment, the vertical vias 693 are filled with a plated metal 620. Likewise, plated metal can be formed on the nucleation layers 612, 614 formed on the top and bottom sides of the molding compound in some embodiments to form trace routing or landing/contact pads. The exemplary vertical via 693 and nucleation layers illustrated in FIG. 6B are intended as an exemplary illustration for laser patterning of an LDS compatible molding compound 600, and can be implemented in the various embodiments described herein utilizing such a material.

In the particular embodiment illustrated in FIG. 6A, the first package level 180 includes a PCB core 110 on the top side of the back side routing layer 102, and a controller chip 120 face-up within a cavity 115 in the PCB core 110. The PD 130, emitters 140 and a second plurality of vertical vias 493 are encapsulated in a second level molding compound 491, which is an LDS compatible material including a dispersed non-conductive metal organic compound. The top side routing layer 460 includes a trace routing 497 which optionally includes a nucleation layer of metal particles of the metal in the dispersed non-conductive metal organic compound. The second plurality of vertical vias 493 may be similarly formed with the nucleation layer of metal particles.

Figure 7:
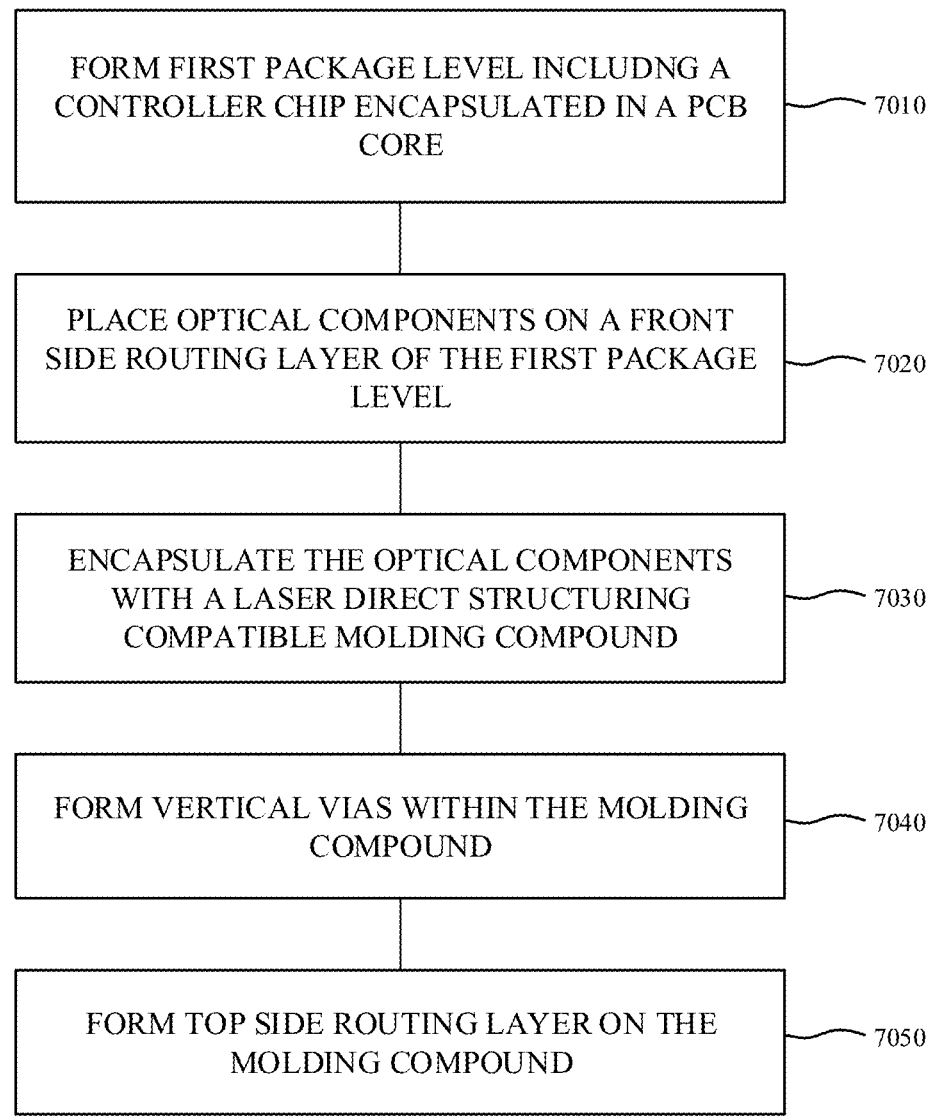
FIG. 7 is a process flow of a method of fabricating the optical package of FIG. 6A in accordance with an embodiment.

FIG. 7 is a process flow of a method of fabricating the optical package of FIG. 6A in accordance with an embodiment. At operation 7010 the first package level 180 is formed including a controller chip 120 encapsulated in a PCB core 110, as previously described. At operation 7020 the optical components (PD and emitters) are placed on a front side routing layer 160 of the first package level 180. For example, front side routing layer 160 may be an RDL. The optical components are then encapsulated with an LDS compatible molding compound 491 at operation 7030. In an embodiment vertical vias 493 are then formed in the molding compound 491 at operation 7040. Formation of vertical vias 493 may include directing a laser at the molding compound 491 to form a nucleation layer of metal particles, following by an electroless plating operation for form a bulk metal layer of the vertical vias 493 on top of the nucleation layer. The top side routing layer (e.g. trace routing 497) is then formed on the molding compound 491 at operation 7050. For example, top side routing layer (e.g. trace routing 497) may also be formed by application of a laser pattern to the surface of the molding compound 491, followed by electroplating of a bulk metal layer pattern on the nucleation layer of metal particles. Alternatively, top side routing layer (e.g. trace routing 497) can be formed similarly as metal traces 466.

Figure 8:
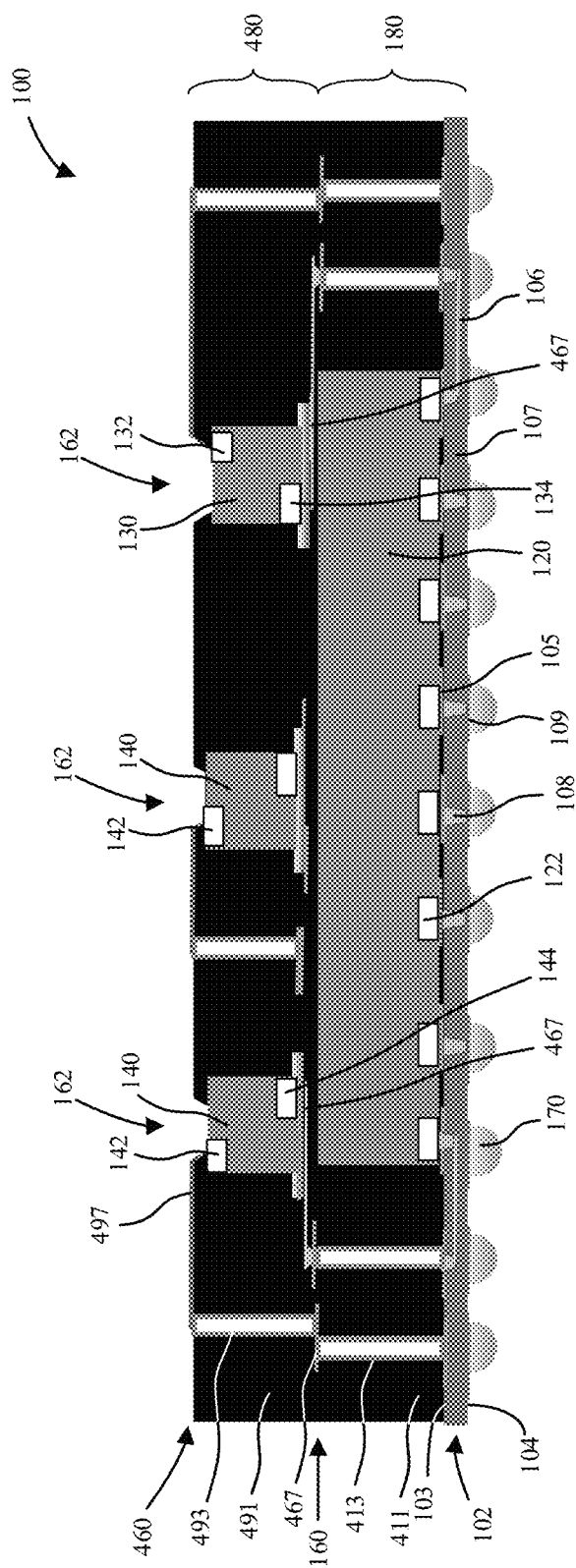
FIG. 8 is a schematic cross-sectional side view illustration of an optical package including optical components stacked on top of a controller chip, with first and second package level laser direct structuring in accordance with an embodiment.

Referring now to FIG. 8, a cross-sectional side view illustration of an optical package 100 is provided including optical components stacked on top of a controller chip, with first and second package level LDS in accordance with an embodiment. The embodiment illustrated in FIG. 8 differs from the embodiment illustrated in FIG. 6A in several respects. Notably, the first package level 180 is formed with an LDS compatible molding compound 411. Additionally, the processing sequence used results in a controller chip 120 that is face-down on the back side routing layer 102, which may optionally be a printed circuit board (PCB). In the embodiment illustrated, the controller chip 120 is encapsulated in an LDS compatible molding compound 411. The front side routing layer 160 may additionally include trace routing 467 that includes a nucleation layer of metal particles of the metal in a dispersed non-conductive metal organic compound in the LDS compatible molding compound 411. Likewise, vertical vias 413 may be similarly formed.

Figure 9:
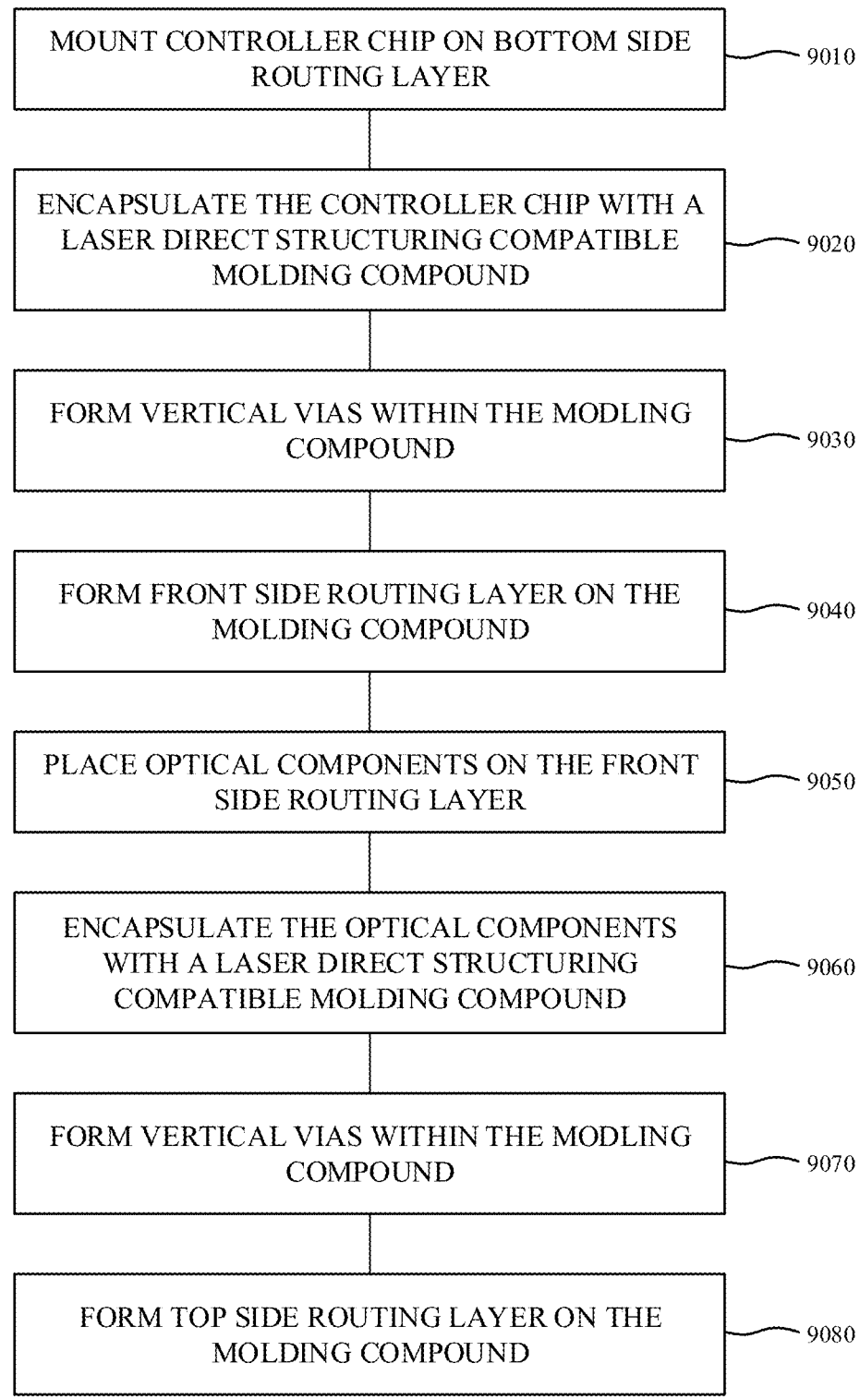
FIG. 9 is a process flow of a method of fabricating the optical package of FIG. 8 in accordance with an embodiment.
Figure 10A:
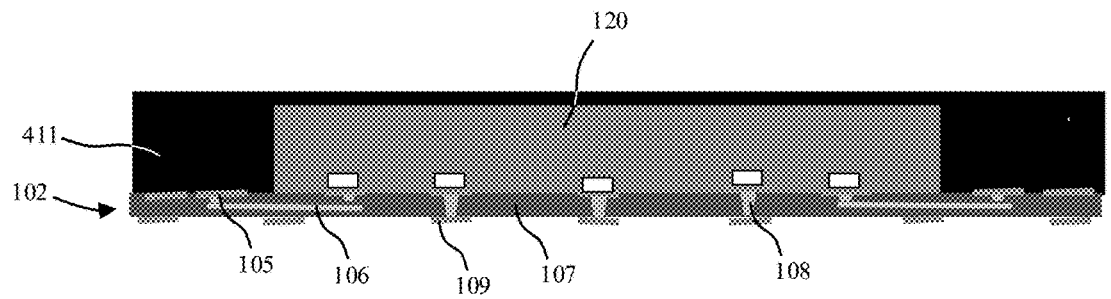
FIGS. 10A-10F are schematic cross-sectional side view illustrations of a method of fabricating the optical package of FIG. 8 in accordance with an embodiment.

FIG. 9 is a process flow of a method of fabricating the optical package of FIG. 8 in accordance with an embodiment. FIGS. 10A-10F are schematic cross-sectional side view illustrations of a method of fabricating the optical package of FIG. 8 in accordance with an embodiment. In interest of clarity and conciseness, the structures and process flow of FIGS. 9 and 10A-10F are described together in the following description. At operation 9010 a controller chip 120 may be mounted on a back side routing layer 102, which may be PCB in an embodiment. As shown in FIG. 10A, the controller chip 120 can be mounted face-down, with contact pads 122 bonded to landing pads 105 or vias 107 of the back side routing layer 102, or PCB. In an embodiment, bonding facilitated by conductive film, conductive paste, or solder bumps. The controller chip is then encapsulated with an LDS compatible molding compound 411 at operation 9020.

Figure 10B:
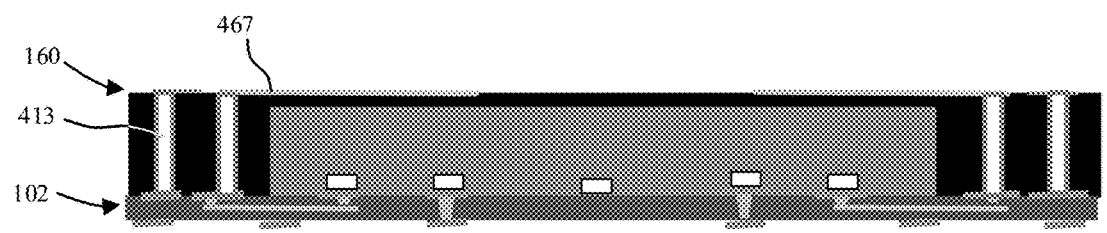

Referring now to FIG. 10B, vertical vias 413 are formed within the molding compound at operation 9030, and front side routing layer 160 is formed on the molding compound at operation 9040. Vertical vias 413 may make contact with landing pads 105. Front side routing layer 160 may include a single layer of trace routing 467 formed using LDS, though additional dielectric and metal routing layers may optionally be included. Alternatively, the vertical vias 413 can be formed prior to encapsulation with the molding compound 411. For example, this can be by plating or gang bonding copper pins to the back side routing layer 102 with solder.

Figure 10C:
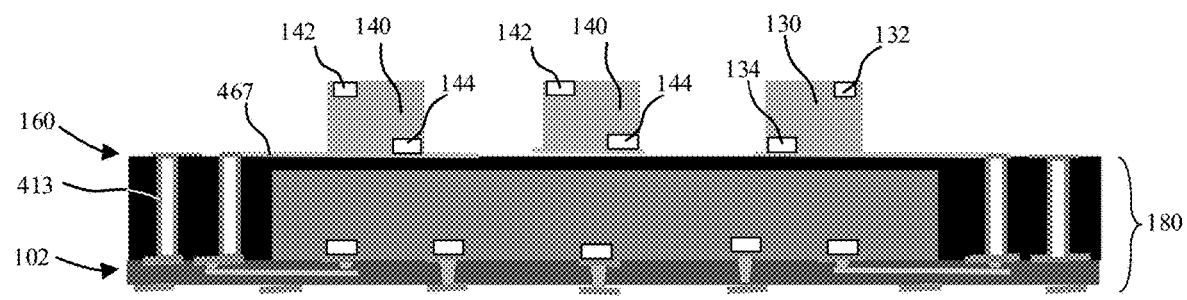

The optical components, including the PD 130 and emitters 140, are then placed onto the front side routing layer 160 at operation 9050, as illustrated in FIG. 10C. In an embodiment, this may be accomplished using conductive film, conductive paste, or solder bonding, so that bottom electrodes 144, 134 are bonded to and in electrical connection with the trace routing 467.

Figure 10D:
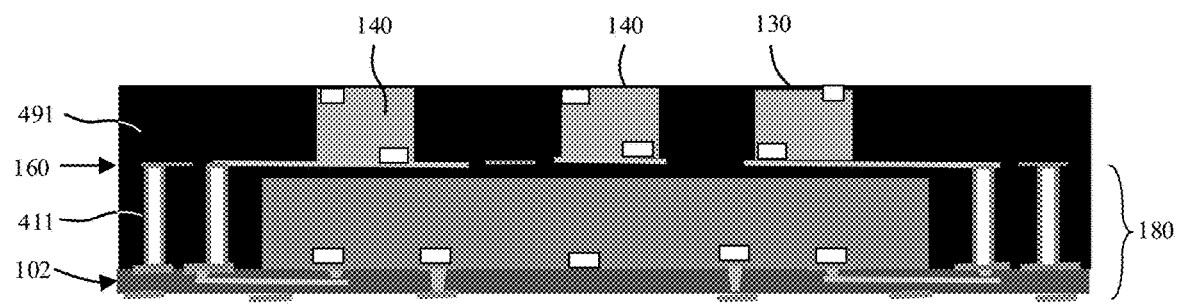
Figure 10E:
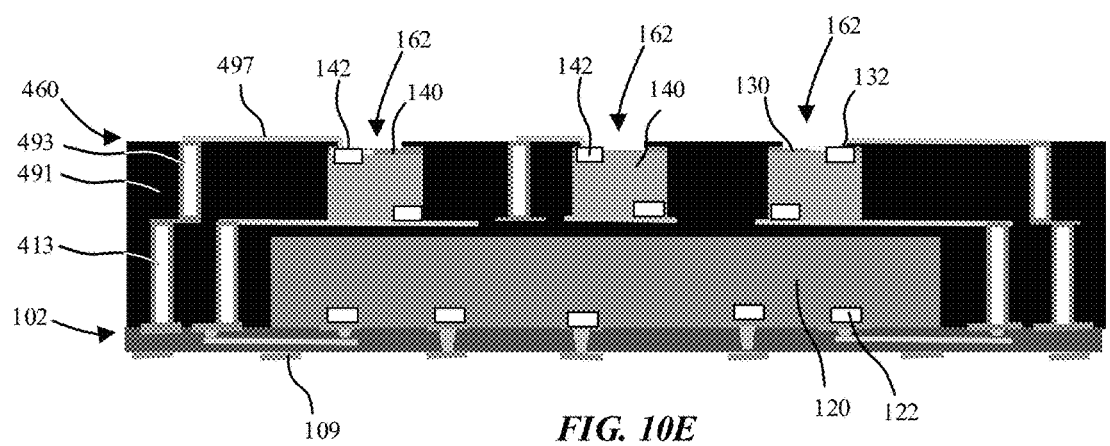
Figure 10F:
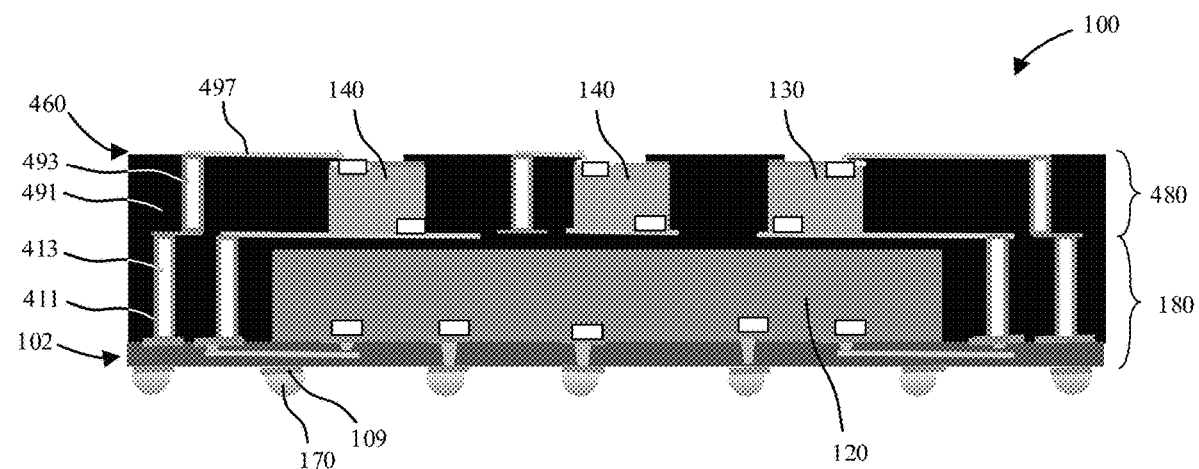

The optical components can then be encapsulated with a second LDS compatible molding compound 491 at operation 9060, as illustrated in FIG. 10D. Referring now to FIG. 10E, vertical vias 493 are formed within the molding compound 491 at operation 9070, and top side routing layer 460 is formed on the molding compound 491 at operation 9080. Vertical vias 493 may make contact with trace routing 467. Top side routing layer 460 may optionally include a single layer of trace routing 497 formed using LDS, though additional dielectric and metal routing layers may optionally be included or formed using alternative techniques. Additionally, apertures 162 are formed with the top side routing layer 460 to expose top surfaces of the optical components. As illustrated, the trace routing 497 may be formed on an in electrical contact with the top electrodes 132, 142 of the optical components. Solder bumps 170 may then be placed on contact pads 109 as illustrated in FIG. 10F for further system integration of the optical package 100.

Figure 11:
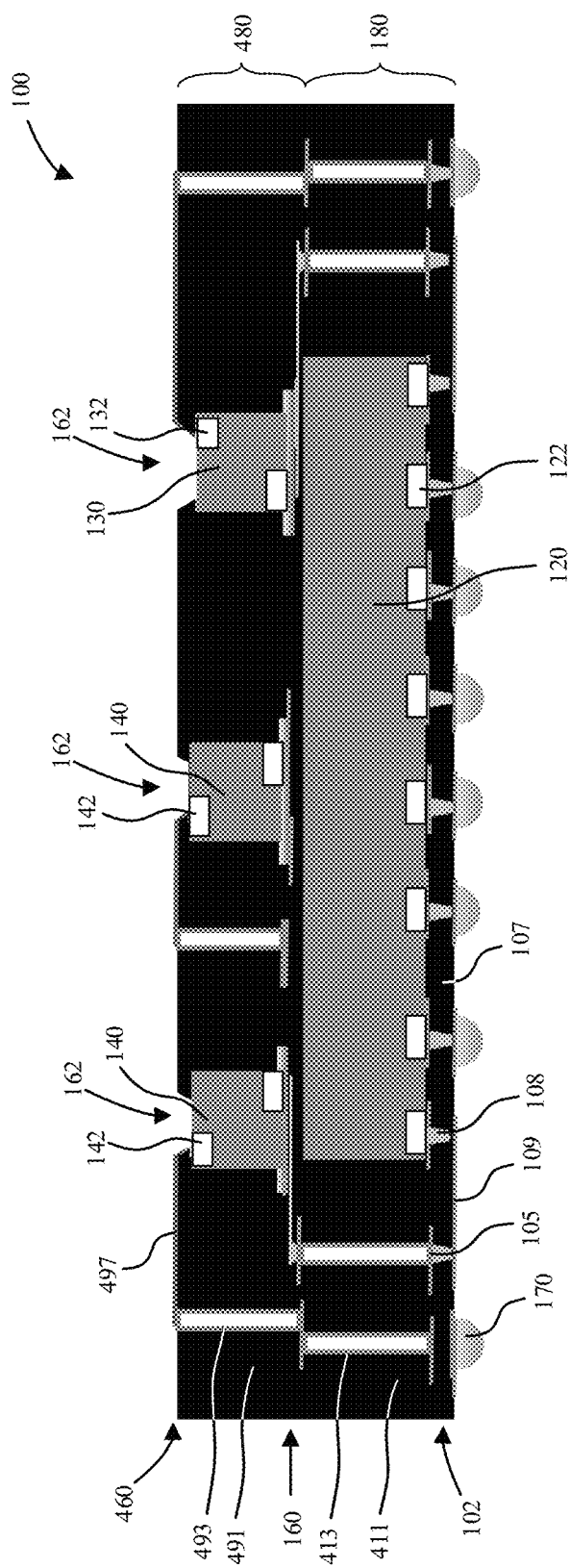
FIG. 11 is a schematic cross-sectional side view illustration of an optical package including optical components stacked on top of a controller chip, with first and second package level laser direct structuring in accordance with an embodiment.
Figure 12:
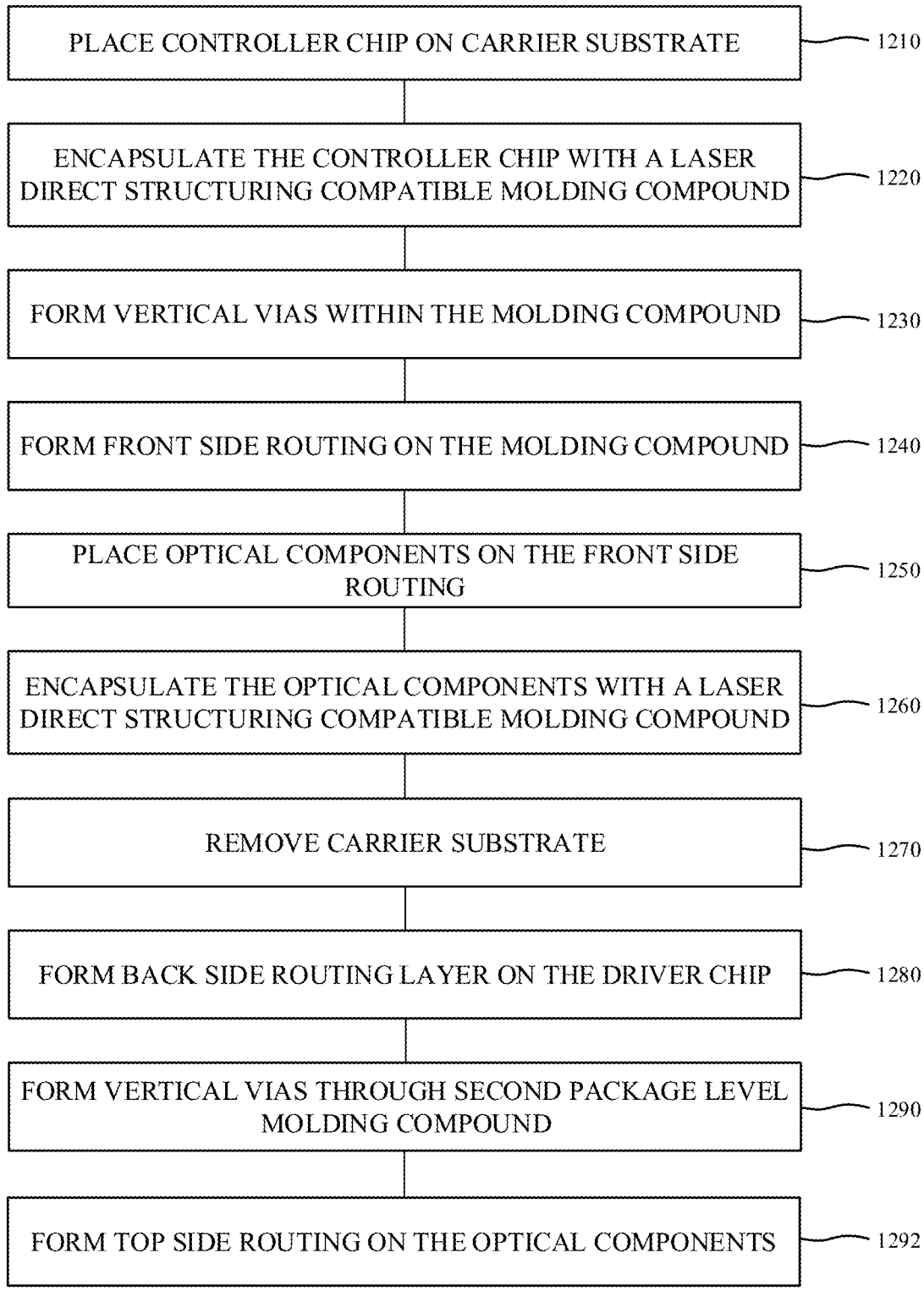
FIG. 12 is a process flow of a method of fabricating the optical package of FIG. 11 in accordance with an embodiment.
Figure 13A:
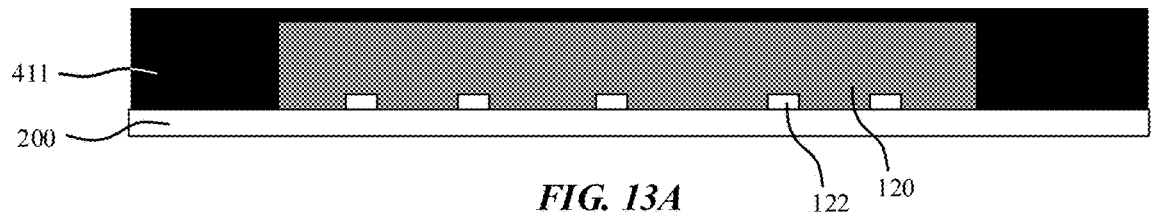
FIGS. 13A-13H are schematic cross-sectional side view illustrations of a method of fabricating the optical package of FIG. 11 in accordance with an embodiment.

FIG. 11 is a schematic cross-sectional side view illustration of another variation of an optical package 100 including optical components stacked on top of a controller chip 120, with first and second package level laser direct structuring in accordance with an embodiment. FIG. 11 is substantially similar to that of FIG. 8, with one difference being that the method of manufacture may be substrate-less, and the back side routing layer 102 may instead by an RDL rather than PCB. FIG. 12 is a process flow of a method of fabricating the optical package of FIG. 11 in accordance with an embodiment. FIGS. 13A-13H are schematic cross-sectional side view illustrations of a method of fabricating the optical package of FIG. 11 in accordance with an embodiment. In interest of clarity and conciseness, the structure of FIG. 11 and process flows and structures of FIGS. 12 and 13A-13H are described together in the following description. At operation 1210 a controller chip 120 is placed on a carrier substrate 200. As illustrated in FIG. 13A, the controller chip may be placed face-down on the carrier substrate, followed by encapsulation with an LDS compatible molding compound 411 at operation 1220.

Figure 13B:
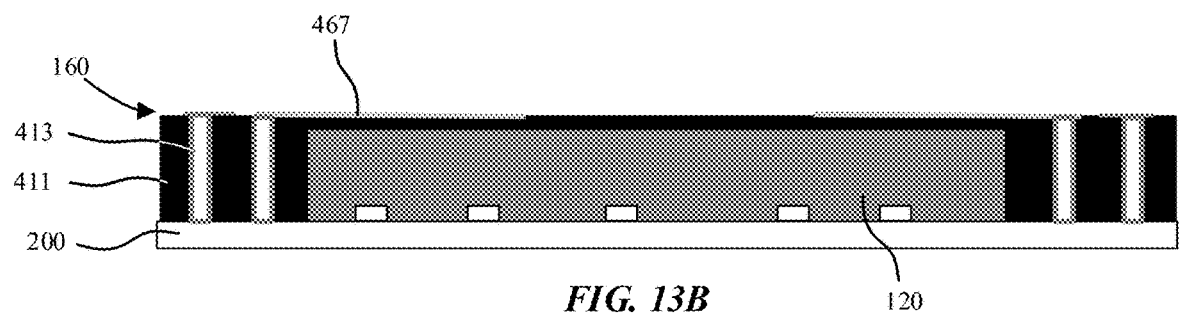
Figure 13C:
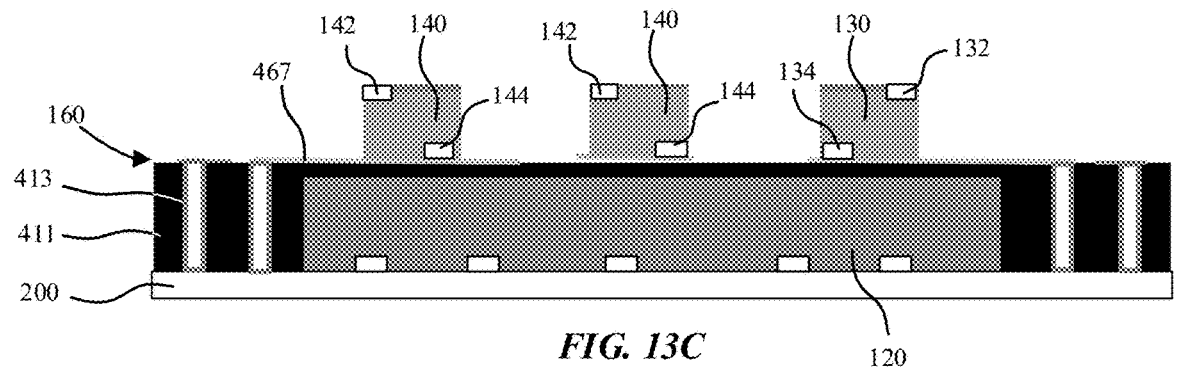

Referring now to FIG. 13B, vertical vias 413 are formed within the molding compound 411 at operation 1230, and front side routing layer 160 is formed on the molding compound 411 at operation 1240. Front side routing layer 160 may include a single layer of trace routing 467 formed using LDS, though additional dielectric and metal routing layers may optionally be included. The optical components, including the PD 130 and emitters 140, are then placed onto the front side routing layer 160 at operation 1250, as illustrated in FIG. 13C. In an embodiment, this may be accomplished using conductive film, conductive paste, or solder bonding, so that bottom electrodes 144, 134 are bonded to and in electrical connection with the trace routing 467.

Figure 13D:
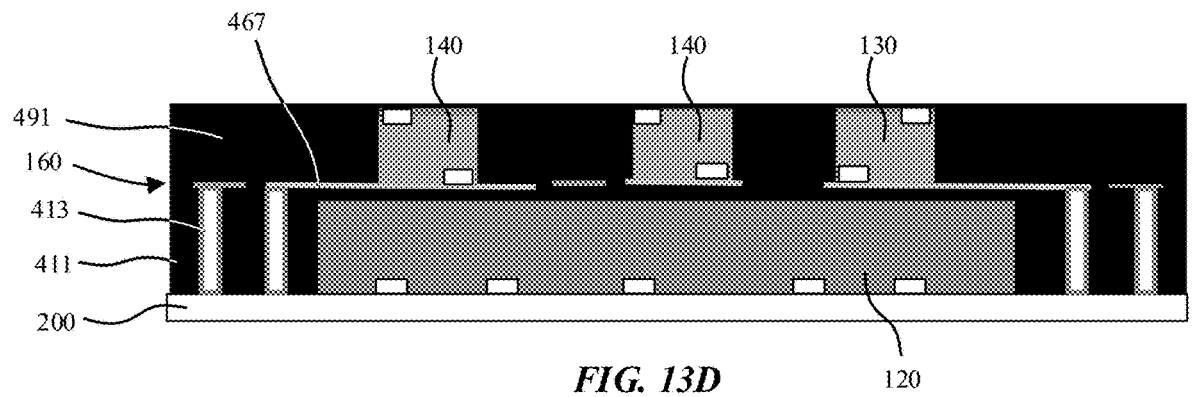
Figure 13E:
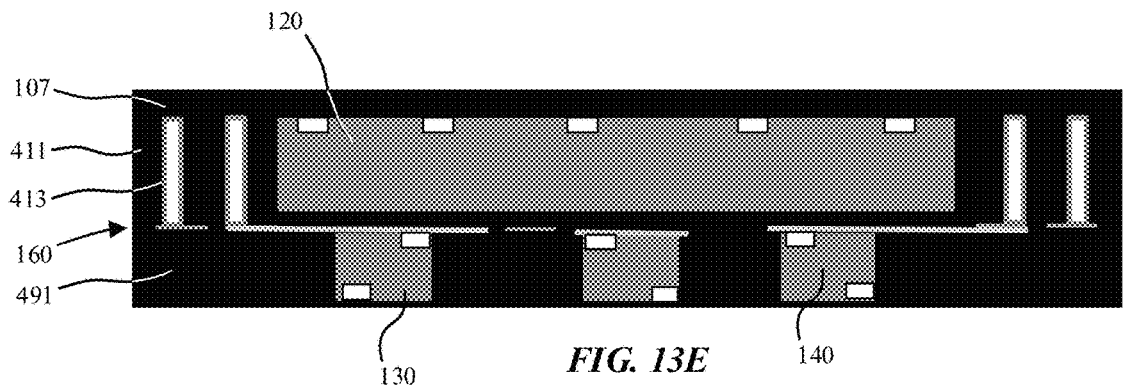
Figure 13F:
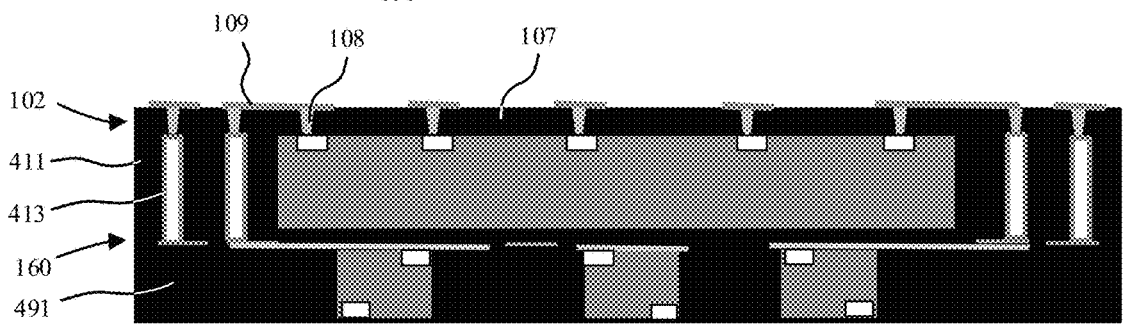

The optical components can then be encapsulated with a second LDS compatible molding compound 491 at operation 1260, as illustrated in FIG. 13D. Referring now to FIGS. 13E-13F, the carrier substrate is removed at operation 1270, followed by the formation of a back side routing layer 102, which may be an RDL, at operation 1280. As shown, the back side routing layer 102 may include a dielectric layer 107, and a plurality of through vias 108, and contact pads 109. In an embodiment, dielectric layer 107 is a photoimageable polymer, and may be a molding compound material.

Figure 13G:
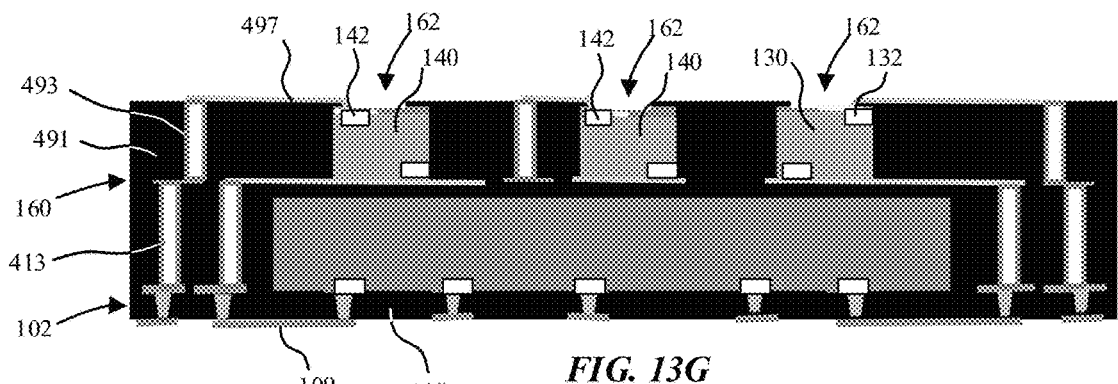
Figure 13H:
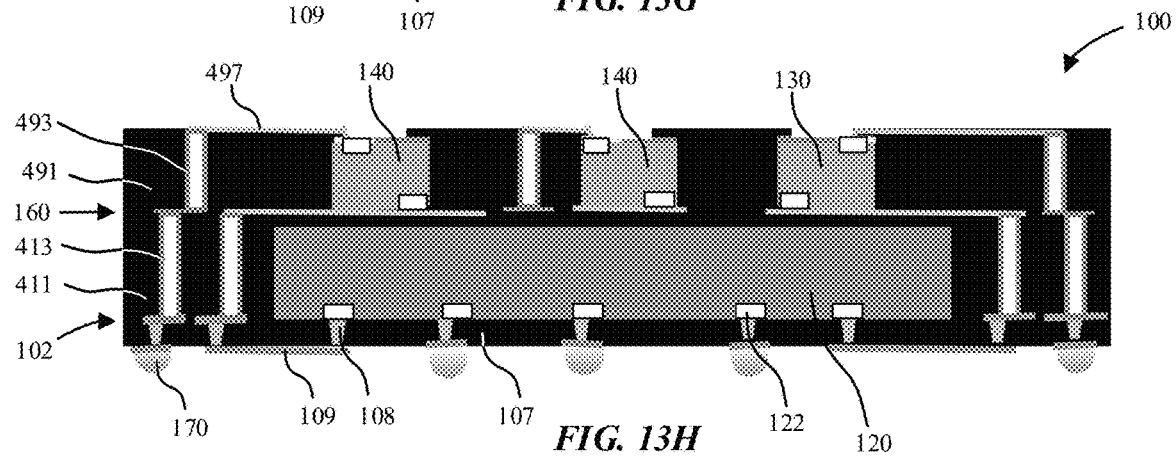

Referring now to FIG. 13G, vertical vias 493 are formed within the molding compound 491 at operation 1290, and top side routing layer 460 is formed on the molding compound 491 at operation 1292. Top side routing layer 460 may include a single layer of trace routing 497 formed using LDS, though additional dielectric and metal routing layers may optionally be included. Additionally, apertures 162 are formed with the top side routing layer 460 to expose top surfaces of the optical components. As illustrated, the trace routing 497 may be formed on an in electrical contact with the top electrodes 132, 142 of the optical components. Solder bumps 170 may then be placed on contact pads 109 as illustrated in FIG. 13H for further system integration of the optical package 100.

Figure 14:
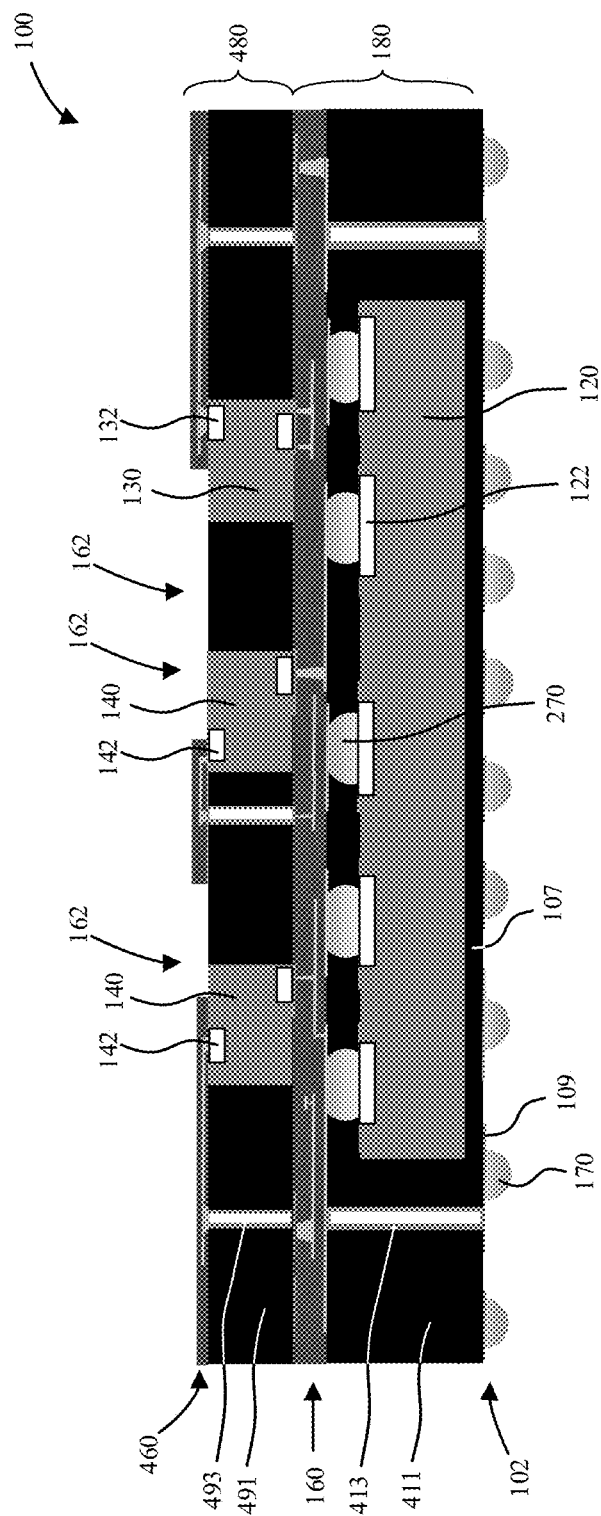
FIG. 14 is a schematic cross-sectional side view illustration of an optical package including optical components stacked on top of a controller chip, with first and second package level laser direct structuring in accordance with an embodiment.
Figure 15:
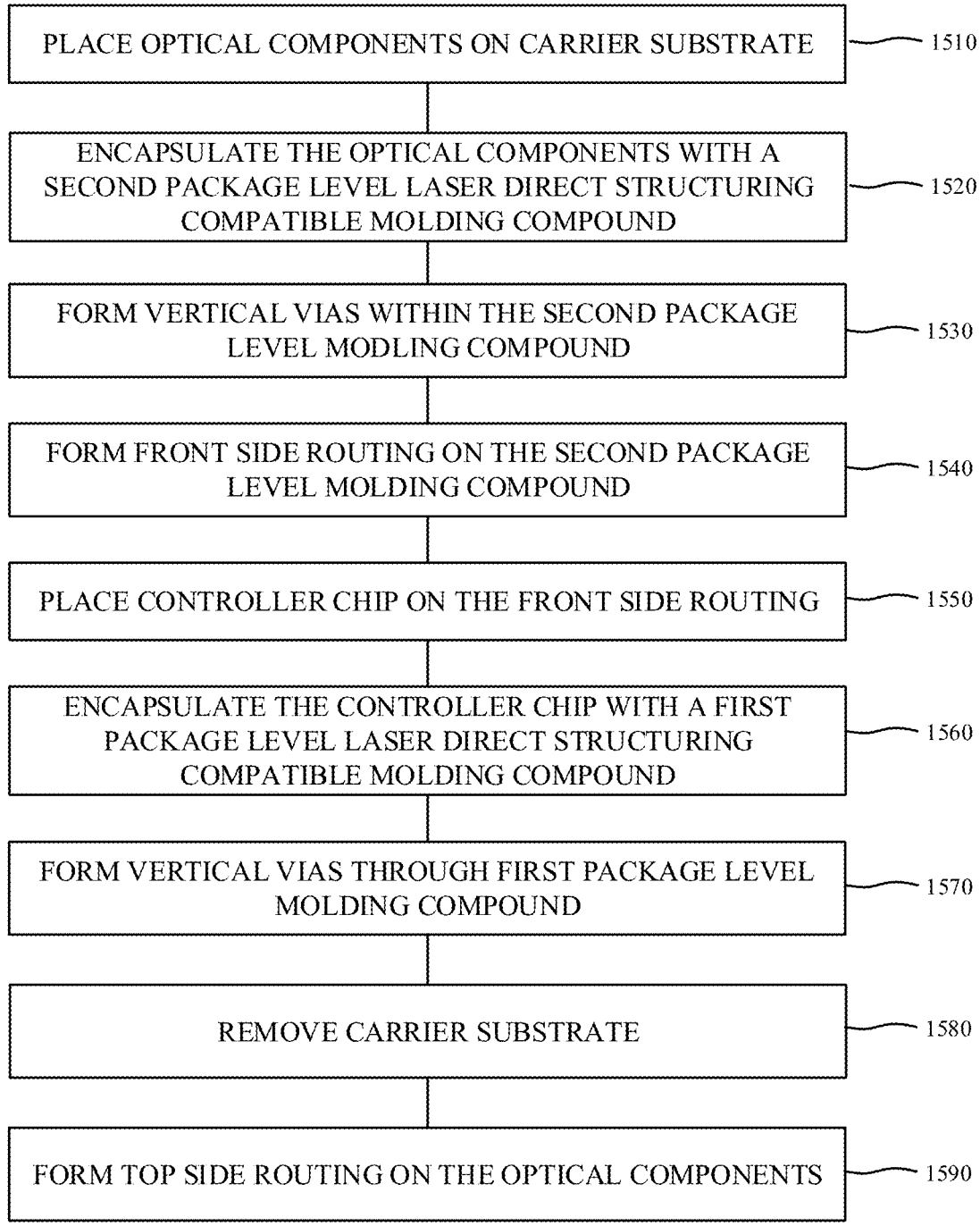
FIG. 15 is a process flow of a method of fabricating the optical package of FIG. 14 in accordance with an embodiment.

FIG. 14 is a schematic cross-sectional side view illustration of an optical package including optical components stacked on top of a controller chip, with first and second package level laser direct structuring in accordance with an embodiment. The optical package 100 of FIG. 14 may be similar to other optical packages including LDS with one difference being that the optical package 100 illustrated in FIG. 14 can be fabricated using a substrate-less packaging approach with the controller chip 120 integrated last. FIG. 15 is a process flow of a method of fabricating the optical package of FIG. 14 in accordance with an embodiment. FIGS. 16A-16H are schematic cross-sectional side view illustrations of a method of fabricating the optical package of FIG. 14 in accordance with an embodiment. In interest of clarity and conciseness, the structure of FIG. 14 and process flows and structures of FIGS. 15 and 16A-16H are described together in the following description.

Figure 16A:
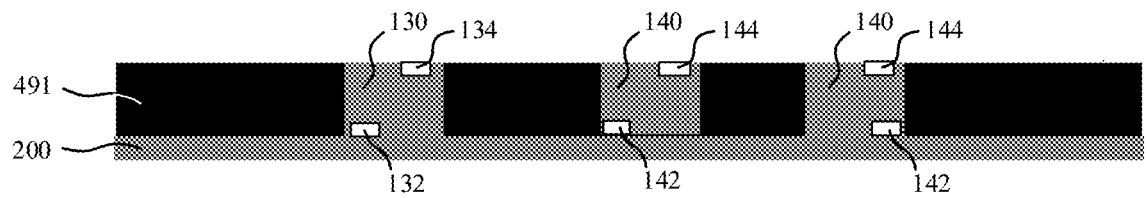
FIGS. 16A-16H are schematic cross-sectional side view illustrations of a method of fabricating the optical package of FIG. 14 in accordance with an embodiment.
Figure 16B:
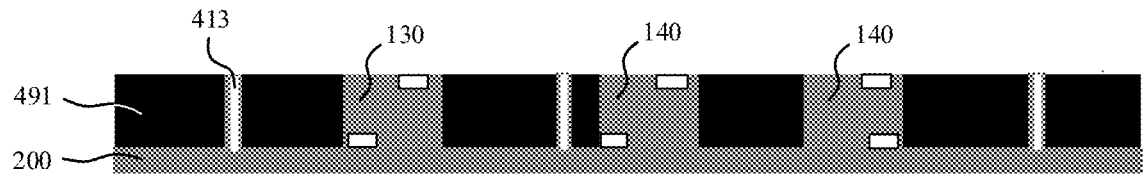
Figure 16C:
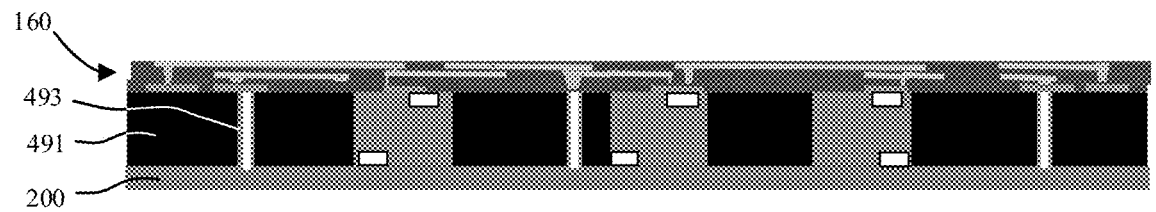
Figure 16D:
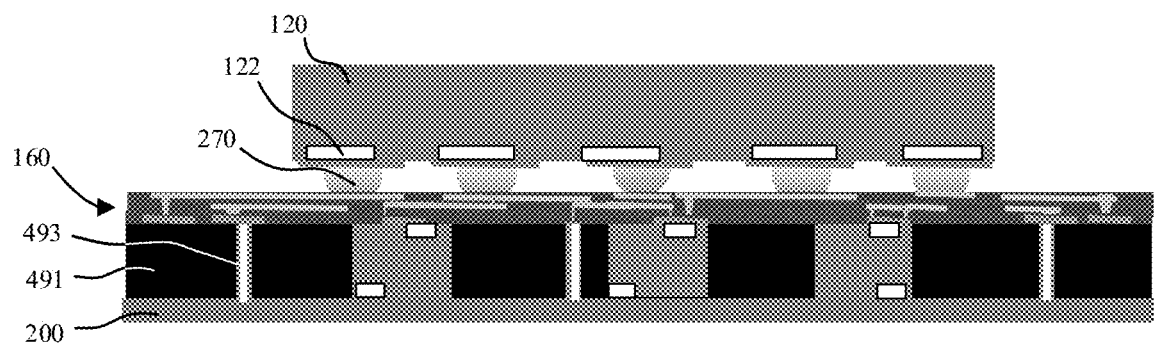
Figure 16E:
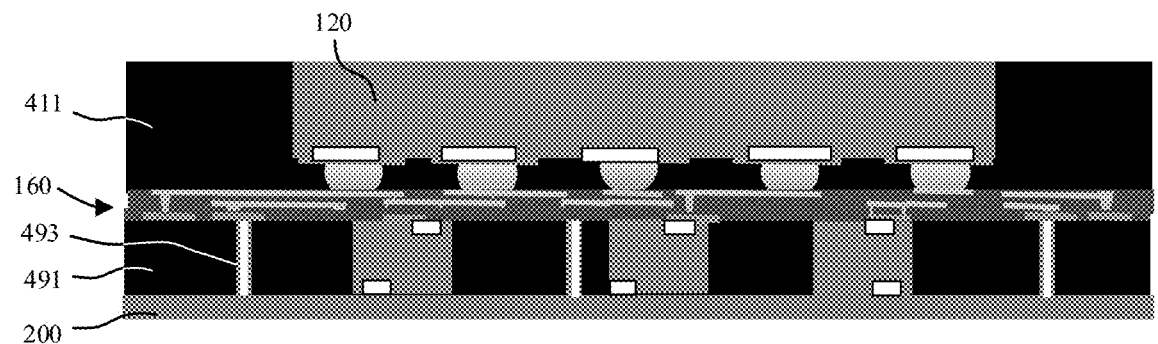
Figure 16F:
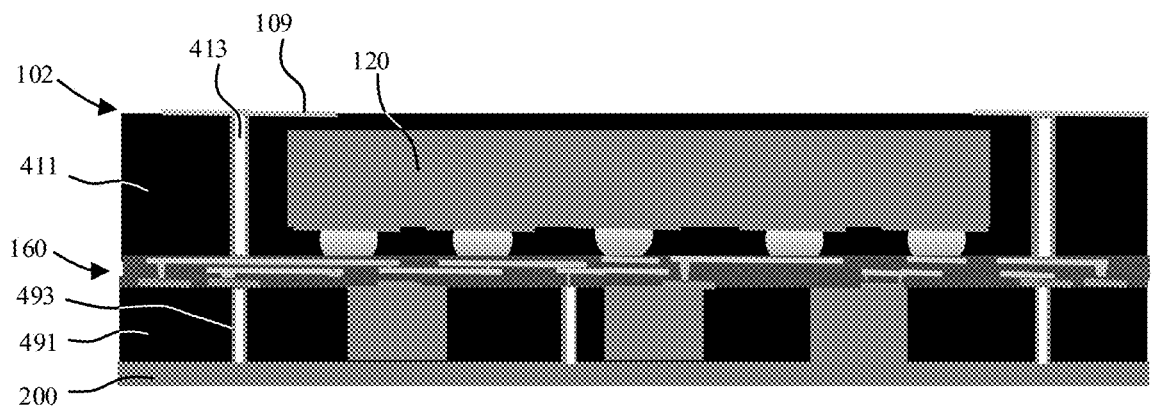

At operation 1510 the optical components are placed on a carrier substrate 200. As illustrated in FIG. 16A, the optical components may be placed with top electrodes 142, 132 face-down on the carrier substrate, followed by encapsulation with an LDS compatible molding compound 491 at operation 1520. Referring now to FIG. 16B, vertical vias 413 are formed within the molding compound 491 at operation 1530, and front side routing layer 160 is formed on the molding compound 491 at operation 1540. As illustrated in FIG. 16C, front side routing layer 160 may be a RDL including one or more dielectric layers and metal routing layers as previously described, and may include a metal routing layer formed directly on the bottom electrodes 144, 134 of the optical components. The controller chip 120 is then placed face-down onto the front side routing layer 160 at operation 1550, as illustrated in FIG. 16D. In an embodiment, this may be accomplished using conductive film, conductive paste, or using solder bumps 270 as illustrated. The controller chip 120 can then be encapsulated with a second LDS compatible molding compound 411 at operation 1560, as illustrated in FIG. 16E. Referring now to FIG. 16F, vertical vias 413 are formed within the molding compound 411 at operation 1570, and back side routing layer 102 is formed on the molding compound 411. Back side routing layer 102 may include a single layer of trace routing formed using LDS, and can include contact pads 109, though additional dielectric and metal routing layers may optionally be included.

Figure 16G:
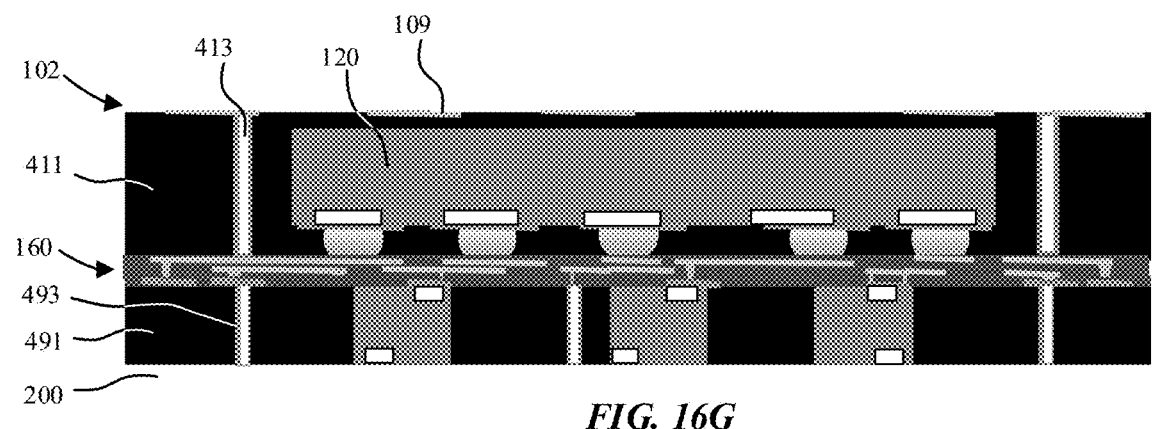
Figure 16H:
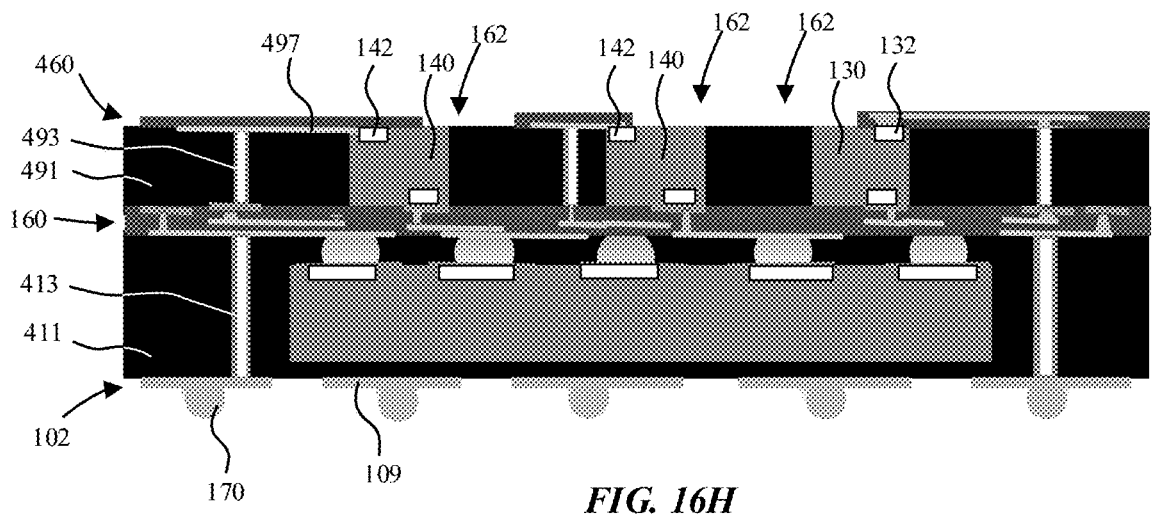

Referring now to FIGS. 16G-16H, the carrier substrate 200 is removed at operation 1580, followed by the formation of a top side routing layer 460, which may be an RDL, at operation 1590. As shown, apertures 162 are formed with the top side routing layer 460 to expose top surfaces of the optical components. As illustrated, the trace routing 497 may be formed on an in electrical contact with the top electrodes 132, 142 of the optical components. Solder bumps 170 may then be placed on contact pads 109 for further system integration of the optical package 100.

Figure 17:
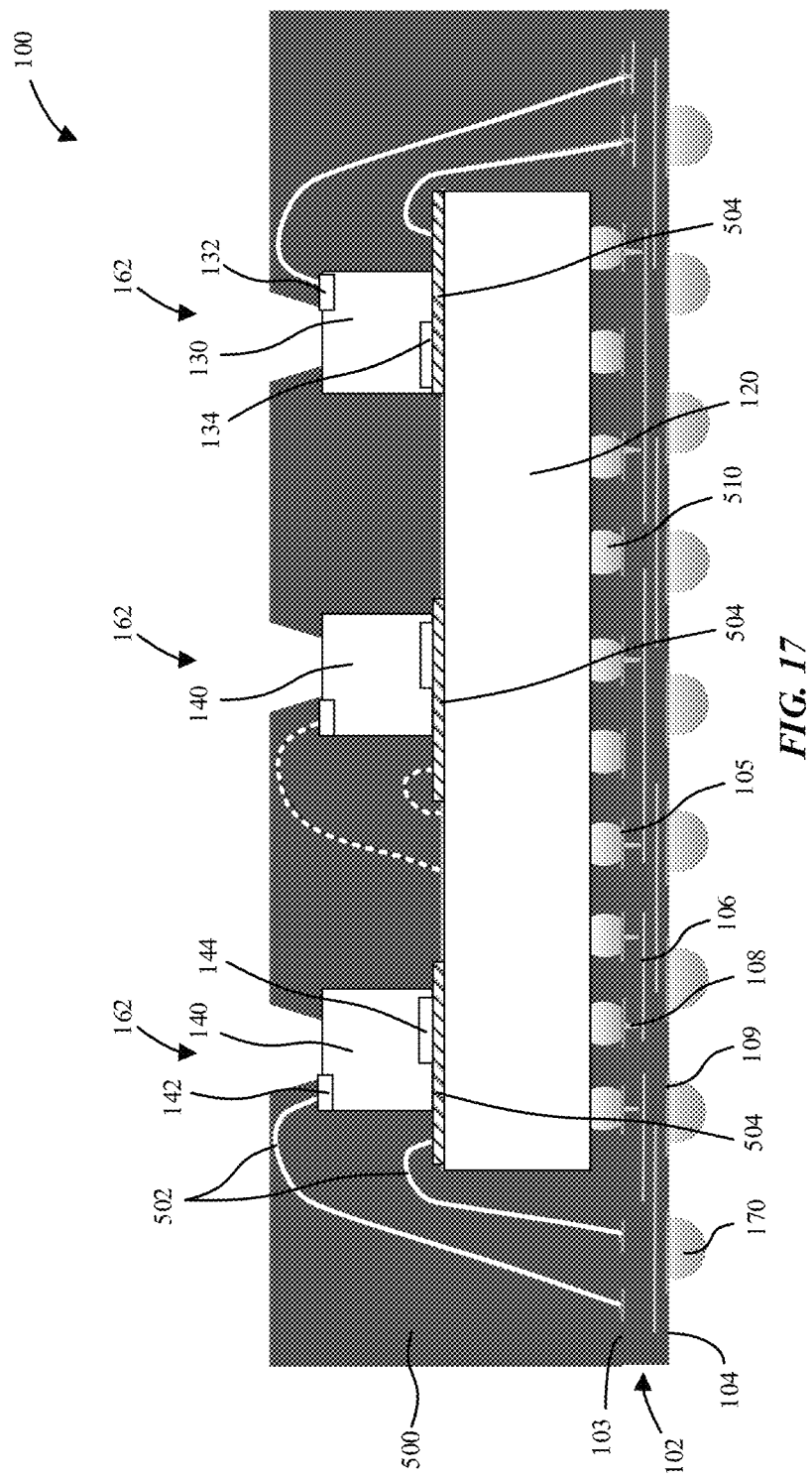
FIG. 17 is a schematic cross-sectional side view illustration of an optical package including optical components stacked on top of a controller chip and wire bonding in accordance with an embodiment.
Figure 18:
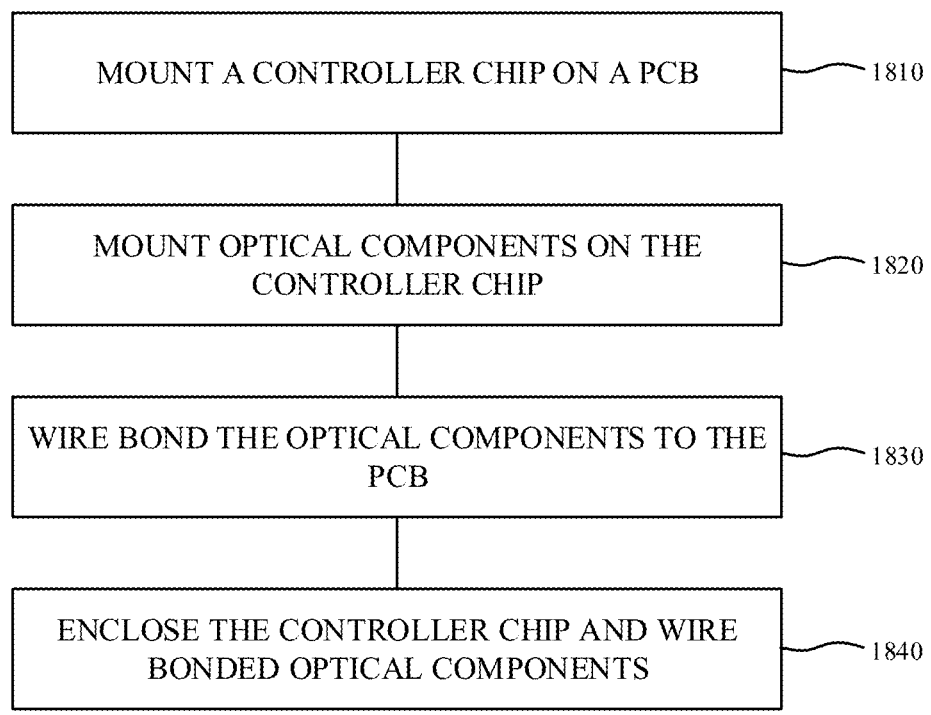
FIG. 18 is a process flow of a method of fabricating the optical package of FIG. 17 in accordance with an embodiment.

FIG. 17 is a schematic cross-sectional side view illustration of an optical package 100 including optical components stacked on top of a controller chip and wire bonding in accordance with an embodiment. FIG. 18 is a process flow of a method of fabricating the optical package of FIG. 17 in accordance with an embodiment. In the illustrated embodiment, the optical package can include a back side routing layer 102, which may be a PCB. The back side routing layer 102 includes including a top side 103 and bottom side 104. At operation 1810 a controller chip 120 is mounted face-down on the back side routing layer 102. For example, this may be accomplished with bonding with solder bumps 510 onto landing pads 105. One or more photodetectors 130 and emitters 140 are attached to the controller chip 120 at operation 1820, and wire bonded using wires 502 bonded to the back side routing layer 102 at operation 1830. As shown, the top electrodes 142, 132 are bonded to landing pads 105 using wires 502. Bottom electrodes 144, 134 can be bonded to trace lines 504 formed on top of the controller chip 120. The trace lines 504 in turn are wire bonded to the landing pads 105 with wires 502. At operation 1840 the wire bonded controller chip and optical components are enclosed. For example, this may be accomplished by mounting a metal lid onto the back side routing layer 102, or with a molding compound 500. FIG. 17 illustrates a molding compound 500 used to encapsulate the controller chip 120, the PD 130 and emitters 140 on the back side routing layer 102. Apertures 162 may additionally be formed over top surfaces of the optical components as previously described. In an embodiment, the molding compound 500 is opaque (e.g. a black mold). Alternatively, a metal lid may be used with similarly located apertures. An exemplary lid may have a shape corresponding to the outer contour of the illustrated molding compound 500, for example.

Figure 19:
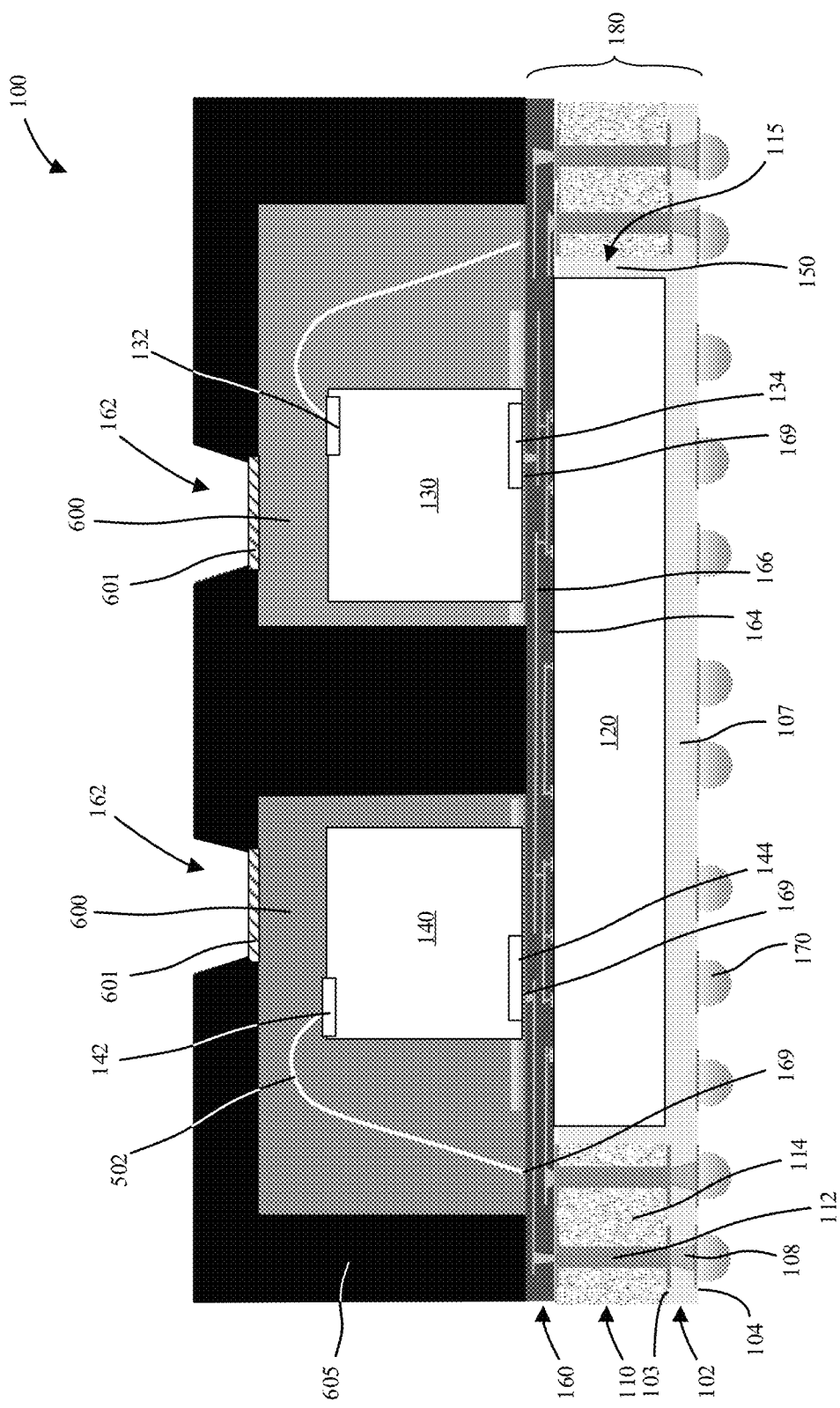
FIG. 19 is a schematic cross-sectional side view illustration of an optical package including optical components stacked on top of a controller chip and wire bonding in accordance with an embodiment.

FIG. 19 is a schematic cross-sectional side view illustration of an optical package 100 including optical components stacked on top of a controller chip 120 and wire bonding in accordance with an embodiment. In particular, the embodiment of FIG. 19 combines certain aspects of the first package level 180 of previous embodiments with wire bonding of the optical components. In an embodiment, an optical package 100 includes a back side routing layer 102 including a top side 103 and bottom side 104, and a PCB core 110 on the top side of the back side routing layer 102. The PCB core 110 includes a plurality of vertical vias 112 and a cavity 115. The controller chip 120 is face-up within the cavity 115, and a molding compound 150 encapsulates the controller chip 120 within the cavity 115. A front side routing layer 160 is on top of the controller chip 120, the molding compound 150, and the PCB core 110. For example, the front side routing layer 160 can be an RDL as previously described. One or more PDs 130 and emitters 140 are mounted on a top side of the front side routing layer 160.

In an embodiment, the PD 130 includes a bottom electrode 134 directly over a first contact pad 169 of the front side routing layer 160, and a top electrode 132 wire bonded to a second contact pad 169 of the front side routing layer 160. The one or more emitter 140 top and bottom electrodes 142, 144 may be similarly connected. In the embodiment illustrated, the PD 130 (and corresponding wire 502) is encapsulated in a first transparent molding compound 600 and the emitter 140 (and corresponding wire 502) is encapsulated in a second transparent molding compound 600 that is separate from the first transparent molding compound.

The optical components may be enclosed using different techniques, such as a metal lid or molding compound. In the illustrated embodiment, an opaque molding compound encapsulates and surrounds the pre-molded PD 130 and emitter 140 (including the transparent molding compounds 600) on the front side routing layer 160. Apertures 162 may be formed as previously described. In an embodiment, a filter layer 601 such as a bandpass filter may be formed underneath the aperture 162 in order to select the wavelengths of light being transmitted through the aperture 162. Alternatively, a metal lid, with similar apertures, may be used in place of the molding compound 605.

Similar to previously described embodiments, a plurality of solder bumps 170 can be placed on the bottom side 104 of the back side routing layer 102 for additional integration. Additionally, the PCB core 110 can include a laminate body 114. The front side routing layer 160 may be an RDL, including one or more metal traces 166 and dielectric layers 164. The back side routing layer 102 may additionally be an RDL, and may optionally include a portion of the molding compound 150 and a plurality of through vias 108 extending through the molding compound 150. The optical package 100 of FIG. 19 may share additional features of other optical packages previously described.

Figure 20:
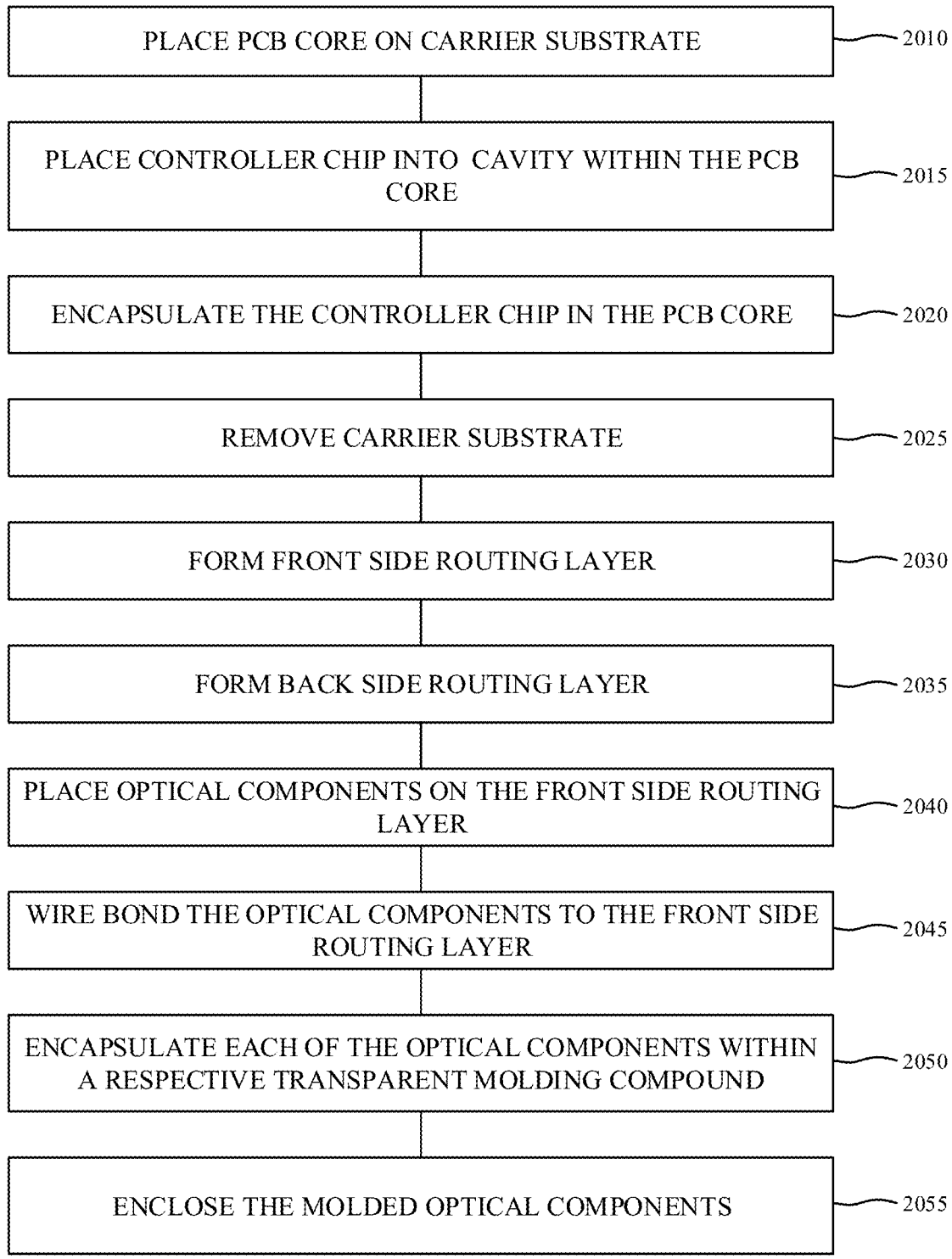
FIG. 20 is a process flow of a method of fabricating the optical package of FIG. 19 in accordance with an embodiment.

FIG. 20 is a process flow of a method of fabricating the optical package of FIG. 19 in accordance with an embodiment. Operations 2010-2035 related to formation of the first package level 180 may be substantially similar to operations 2010-2060 described with regard to FIG. 2, less the optical components. At operation 2010 a PCB core 110 is placed onto a carrier substrate 200. The controller chip 120 is placed into a cavity 115 within the PCB core 110 at operation 2015 and encapsulated at operation 2020. The carrier substrate 200 can then be removed at operation 2025, followed by the formation of the front side routing layer 160 at operation 2030 and back side routing layer 102 at operation 2035.

The optical components, including one or more PDs 130 and emitters 140, are then placed on the front side routing layer 160 at operation 2040 and wire bonded to the front side routing layer 160 at operation 2045. Each of the optical components is then encapsulated within a transparent molding compound 600 at operation 2050, followed by enclosing the molded optical components at operation 2055, for example by attaching a lid or molding with an opaque molding compound 605.

Figure 21A:
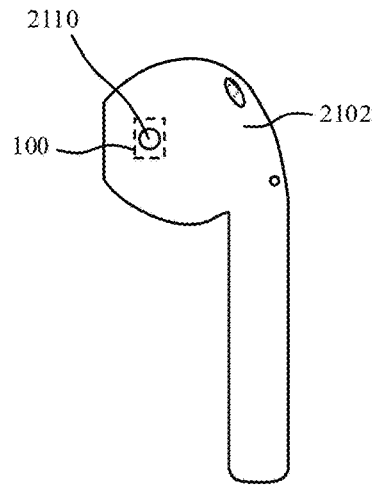
FIGS. 21A-21B are schematic side view illustrations of an earbud in accordance with an embodiment.
Figure 21B:
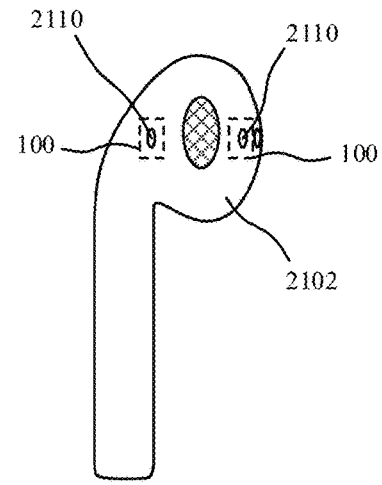
Figure 22:
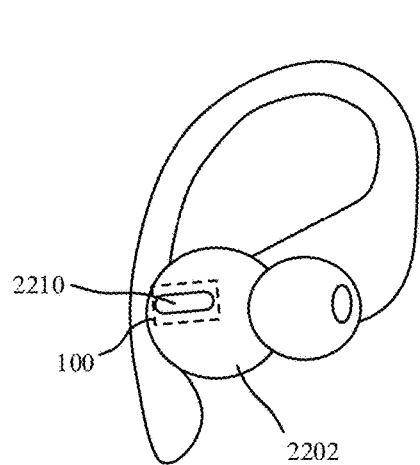
FIG. 22 is a schematic side view illustration of an earpiece in accordance with an embodiment.
Figure 23:
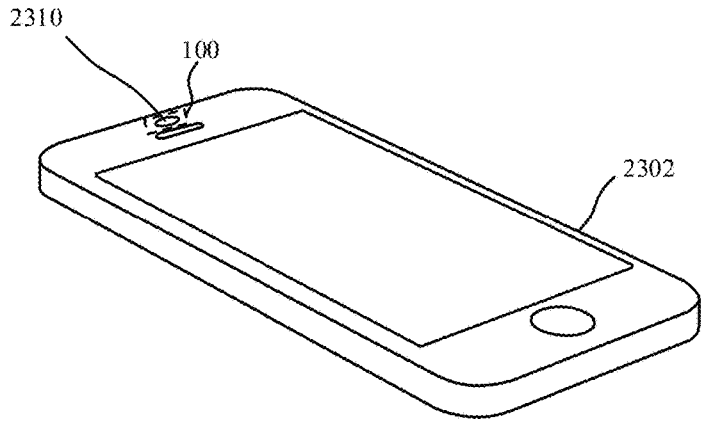
FIG. 23 is a schematic side view illustration of a mobile phone in accordance with an embodiment.

FIGS. 21A-23 illustrate various portable electronic devices in which the various embodiments can be implemented. FIGS. 21A-21B are schematic side view illustrations of an earbud in accordance with an embodiment that includes a housing 2102 and one or more openings 2110 to which the apertures 162 of the optical packages 100 described herein can be aligned. FIG. 22 is a schematic side view illustration of an earpiece in accordance with an embodiment that includes a housing 2202 including an opening 2210 to which the apertures 162 of the optical packages 100 described herein can be aligned. FIG. 23 is a schematic side view illustration of a mobile phone in accordance with an embodiment including a housing 2302 including an opening 2310 to which the apertures 162 of the optical packages 100 described herein can be aligned. These illustrations are intended to be exemplary and non-exhaustive implementations.

In utilizing the various aspects of the embodiments, it would become apparent to one skilled in the art that combinations or variations of the above embodiments are possible for forming an optical package. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An optical package comprising:
   a back side routing layer including a top side and bottom side;
   a printed circuit board (PCB) core on the top side of the back side routing layer, the PCB core including a plurality of vertical vias and a plurality of cavities;
   a controller chip face-up within a first cavity of the plurality of cavities;
   a photodetector (PD) within a second cavity of the plurality of cavities;
   a molding compound encapsulating the controller chip within the first cavity and the PD within the second cavity;
   a front side routing layer on top of the controller chip, the molding compound, and the PCB core; and
   an aperture within the front side routing layer over the PD.

2. The optical package of claim 1, further comprising an emitter within a third cavity of the plurality of cavities, and a second aperture within the front side routing layer over the emitter.

3. The optical package of claim 2, further comprising a plurality of solder bumps on the bottom side of the back side routing layer.

4. The optical package of claim 2, wherein the PCB core comprises a laminate body.

5. The optical package of claim 2, wherein the front side routing layer includes a first contact pad on a top electrode of the PD, and the PD comprises a bottom electrode electrically connected to the back side routing layer.

6. The optical package of claim 5, further comprising a via extending through a portion of the molding compound to electrically connect the bottom electrode of the PD to the back side routing layer.

7. The optical package of claim 1, wherein the front side routing layer is a front redistribution layer (RDL) comprising one or more metal traces and one or more dielectric layers.

8. The optical package of claim 1, wherein the back side routing layer is a redistribution layer (RDL) comprising the molding compound and a plurality of through vias through the molding compound.

9. The optical package of claim 1, wherein the front side routing layer includes a first contact pad on a top electrode of the PD, and the PD comprises a bottom electrode electrically connected to the back side routing layer.

10. The optical package of claim 9, further comprising:
    a first emitter within a third cavity of the plurality of cavities, and a second aperture within the front side routing layer over the first emitter; and
    a second emitter within a fourth cavity of the plurality of cavities, and a third aperture within the front side routing layer over the second emitter.

11. The optical package of claim 10, wherein the first emitter is designed to emit at a different wavelength than the second emitter.

12. The optical package of claim 9, wherein the first contact pad of the front side routing layer is directly on the top electrode of the PD.

13. The optical package of claim 12, wherein the back side routing layer includes a via extending through the molding compound to contact the bottom electrode of the PD.

14. The optical package of claim 12, further comprising a plurality of solder bumps on the bottom side of the back side routing layer.

15. The optical package of claim 12, wherein the PCB core comprises a laminate body.

* * * * *